United States Patent
Takizawa

(10) Patent No.: US 11,282,808 B2
(45) Date of Patent: Mar. 22, 2022

(54) INERTIAL SENSOR, ELECTRONIC INSTRUMENT, VEHICLE, AND METHOD FOR MANUFACTURING INERTIAL SENSOR

(71) Applicant: Seiko Epson Corporation, Tokyo (JP)

(72) Inventor: Teruo Takizawa, Matsumoto (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 16/857,677

(22) Filed: Apr. 24, 2020

(65) Prior Publication Data
US 2020/0343213 A1  Oct. 29, 2020

(30) Foreign Application Priority Data
Apr. 26, 2019 (JP) .............. JP2019-085265

(51) Int. Cl.
*H01L 23/00* (2006.01)
*B81B 7/00* (2006.01)
(52) U.S. Cl.
CPC ............ *H01L 24/32* (2013.01); *B81B 7/0048* (2013.01); *H01L 2924/1461* (2013.01)
(58) Field of Classification Search
CPC ................. H01L 24/32; H01L 2924/1461
See application file for complete search history.

(56) References Cited

U.S. PATENT DOCUMENTS

| 9,343,367 B2 | 5/2016 | Goida et al. |
| 9,698,127 B2 | 7/2017 | Goida et al. |
| 2002/0096766 A1* | 7/2002 | Chen .............. H01L 23/3128 257/738 |
| 2006/0255441 A1* | 11/2006 | Ohta ............... G01C 19/56 257/680 |
| 2014/0247565 A1 | 9/2014 | Kobayashi |
| 2017/0199217 A1 | 7/2017 | Naruse et al. |

FOREIGN PATENT DOCUMENTS

| JP | 2006-250760 A | 9/2006 |
| JP | 2013-092487 A | 5/2013 |
| JP | 2014-169868 A | 9/2014 |
| JP | 2017-133945 A | 8/2017 |
| WO | 2014/042055 A1 | 3/2014 |

\* cited by examiner

*Primary Examiner* — Errol V Fernandes
(74) *Attorney, Agent, or Firm* — Harness, Dickey & Pierce, P.L.C.

(57) ABSTRACT

An inertial sensor includes a support substrate, a sensor main body supported by the support substrate, and a bonding member that is located between the support substrate and the sensor main body and bonds the sensor main body to the support substrate. The sensor main body includes a substrate bonded to the support substrate via the bonding member and a capacitance-type sensor device provided at a side of the substrate opposite to the support substrate. The substrate has a side surface, a first principal surface facing the support substrate, and a recessed step section that is located between the side surface and the first principal surface and connects the side surface to the first principal surface. The bonding member extends along the first principal surface and the step section.

8 Claims, 26 Drawing Sheets

INERTIAL SENSOR, ELECTRONIC INSTRUMENT, VEHICLE, AND METHOD FOR MANUFACTURING INERTIAL SENSOR

The present application is based on, and claims priority from JP Application Serial Number 2019-085265, filed Apr. 26, 2019, the disclosure of which is hereby incorporated by reference herein in its entirety.

BACKGROUND

1. Technical Field

The present disclosure relates to an inertial sensor, an electronic instrument, a vehicle, and a method for manufacturing the inertial sensor.

2. Related Art

An inertial sensor described in WO2014/042055 includes a printed substrate and a MEMS sensor fixed to the printed substrate via a die-bonding resin. The MEMS sensor is a capacitance-type acceleration sensor that includes a sensor substrate, a sensor device provided on the sensor substrate, and electrodes and forms capacitance between a movable element and each of the electrodes.

In the inertial sensor described in WO2014/042055, however, the die-bonding resin could undesirably rise in the form of a fillet along the side surface of the MEMS sensor. When the die-bonding resin rises along the side surface, thermal expansion of the die-bonding resin causes large stress to be transmitted to a surface of the sensor substrate that is the surface on which the sensor device is provided. The stress changes the distance between the movable element and each of the electrodes, resulting in a problem of deterioration of the detection characteristics of the inertial sensor.

SUMMARY

An inertial sensor according to an aspect of the present disclosure includes a support substrate, a sensor main body supported by the support substrate, and a bonding member that is located between the support substrate and the sensor main body and bonds the sensor main body to the support substrate. The sensor main body includes a substrate bonded to the support substrate via the bonding member and a capacitance-type sensor device provided at a side of the substrate opposite to the support substrate. The substrate has a side surface, a first principal surface facing the support substrate, and a recessed step section that is located between the side surface and the first principal surface and connects the side surface to the first principal surface. The bonding member extends along the first principal surface and the step section.

DESCRIPTION OF EXEMPLARY EMBODIMENTS

An inertial sensor, an electronic instrument, a vehicle, and a method for manufacturing the inertial sensor according to the present disclosure will be described below in detail based on embodiments shown in the accompanying drawings.

First Embodiment

Figure 1:
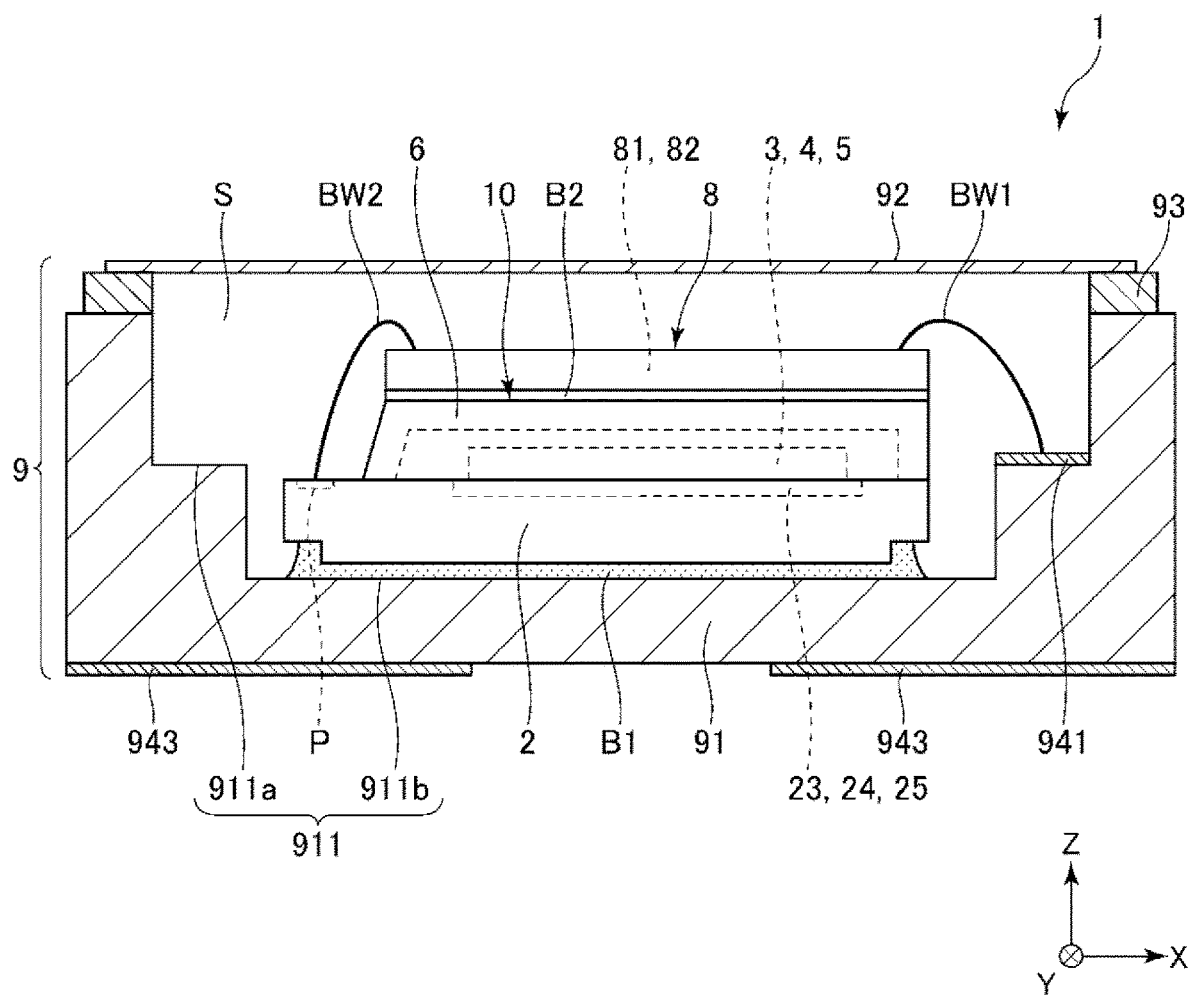
FIG. 1 is a cross-sectional view showing an inertial sensor according to a first embodiment.
Figure 2:
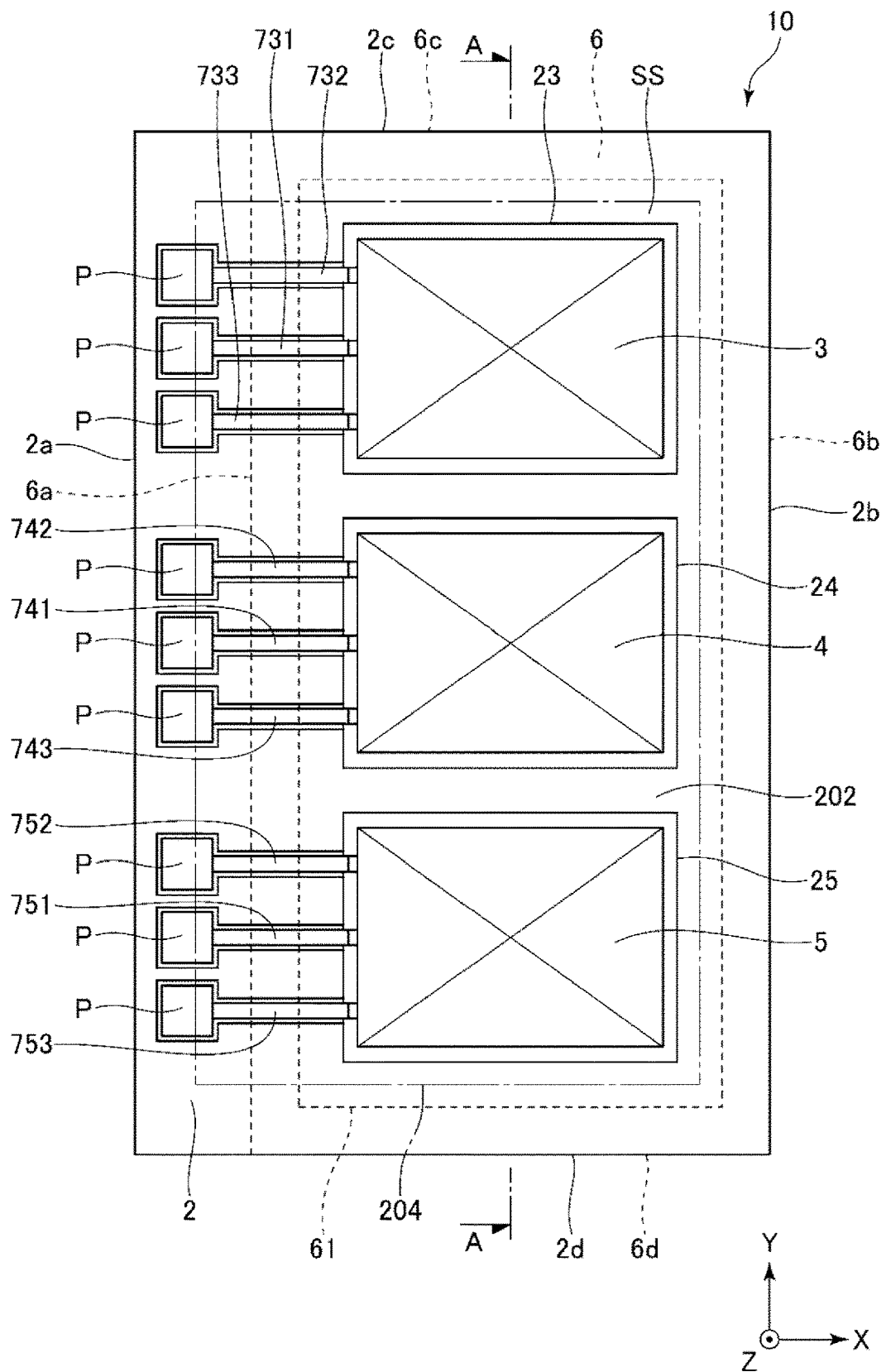
FIG. 2 is a plan view of a sensor main body of the inertial sensor shown in FIG. 1.
Figure 3:
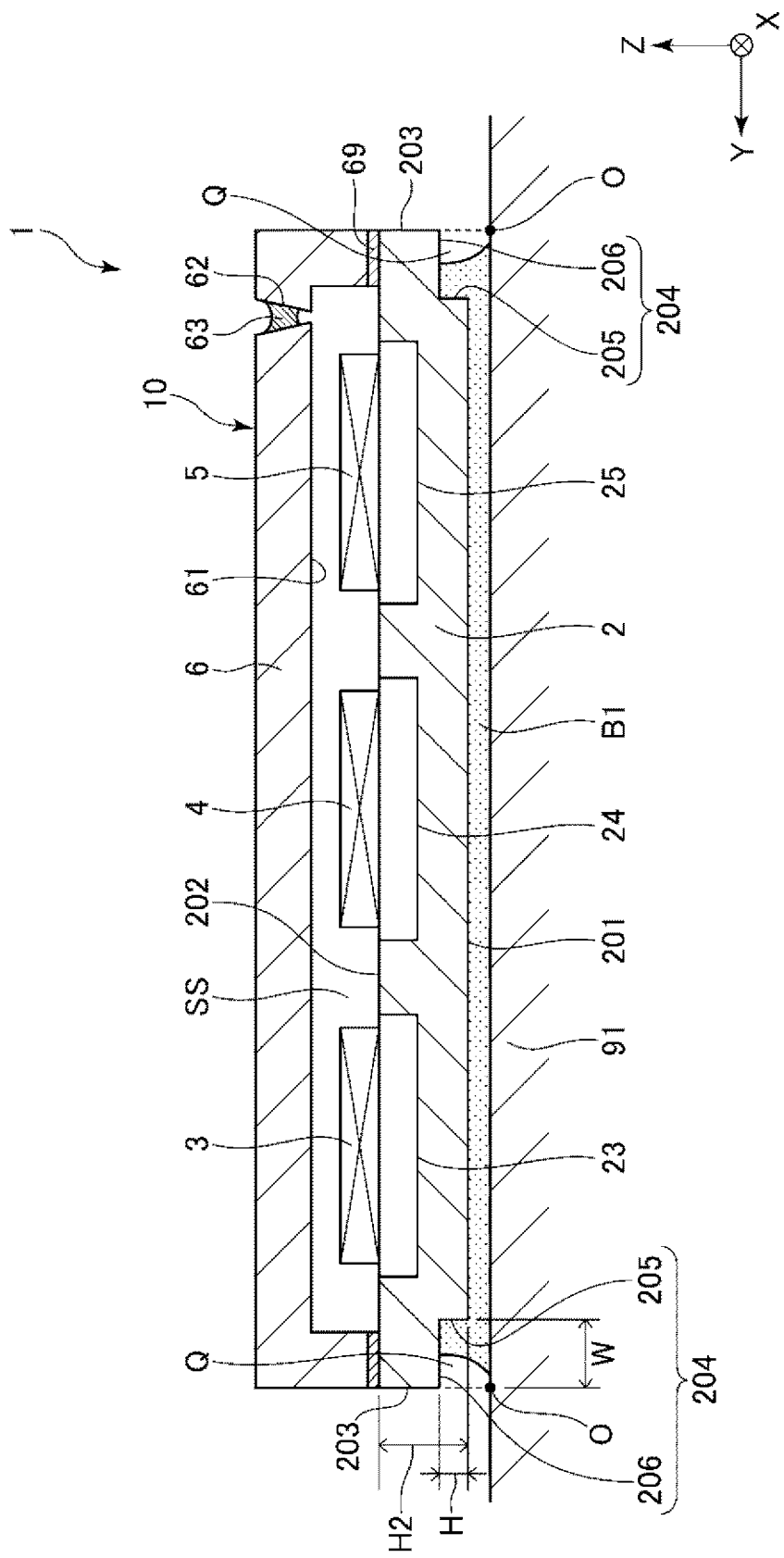
FIG. 3 is a cross-sectional view of the sensor main body taken along the line A-A in FIG. 2.
Figure 4:
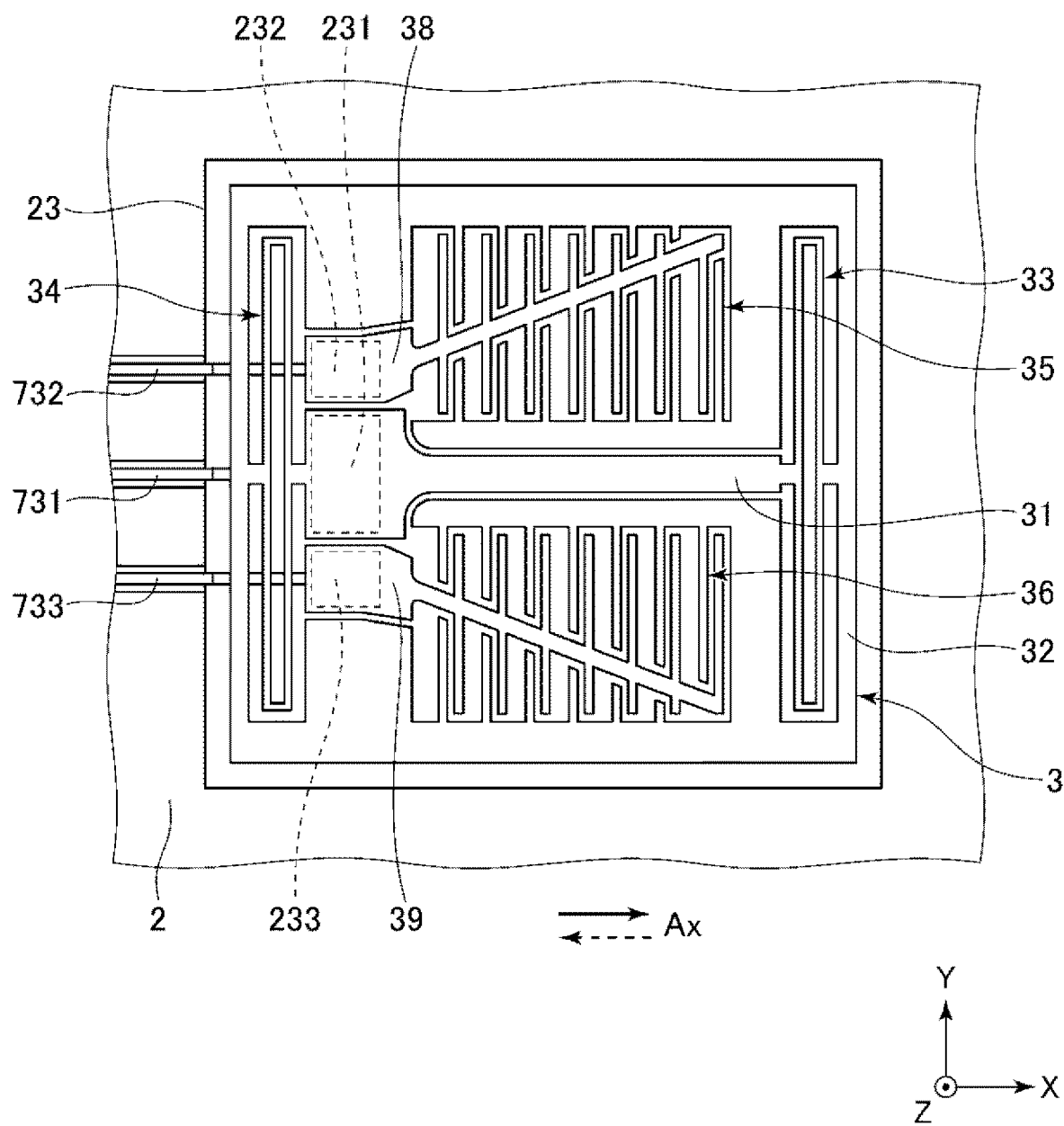
FIG. 4 is a plan view showing an example of a sensor device that detects acceleration in an axis-X direction.
Figure 5:
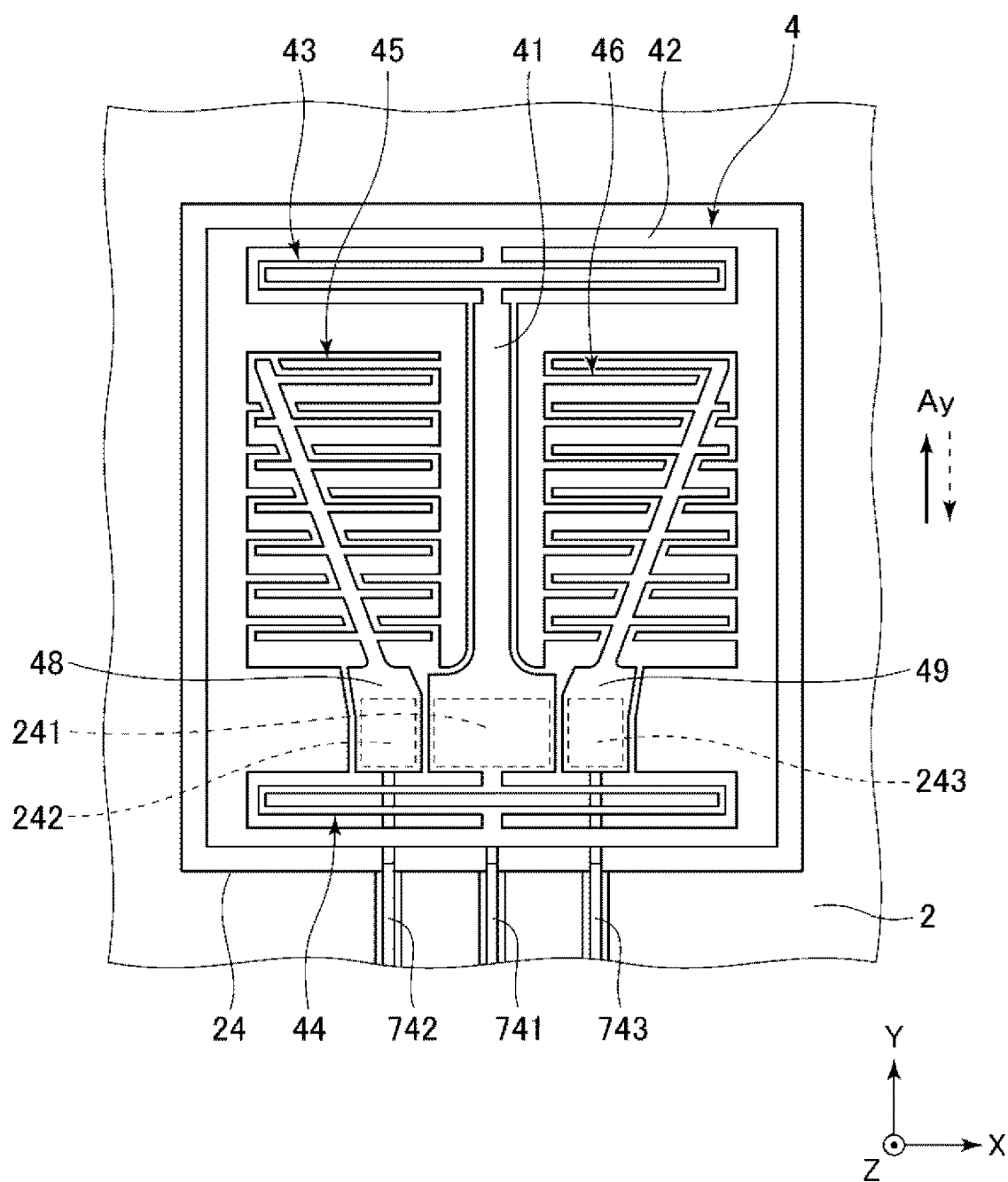
FIG. 5 is a plan view showing an example of a sensor device that detects acceleration in an axis-Y direction.
Figure 6:
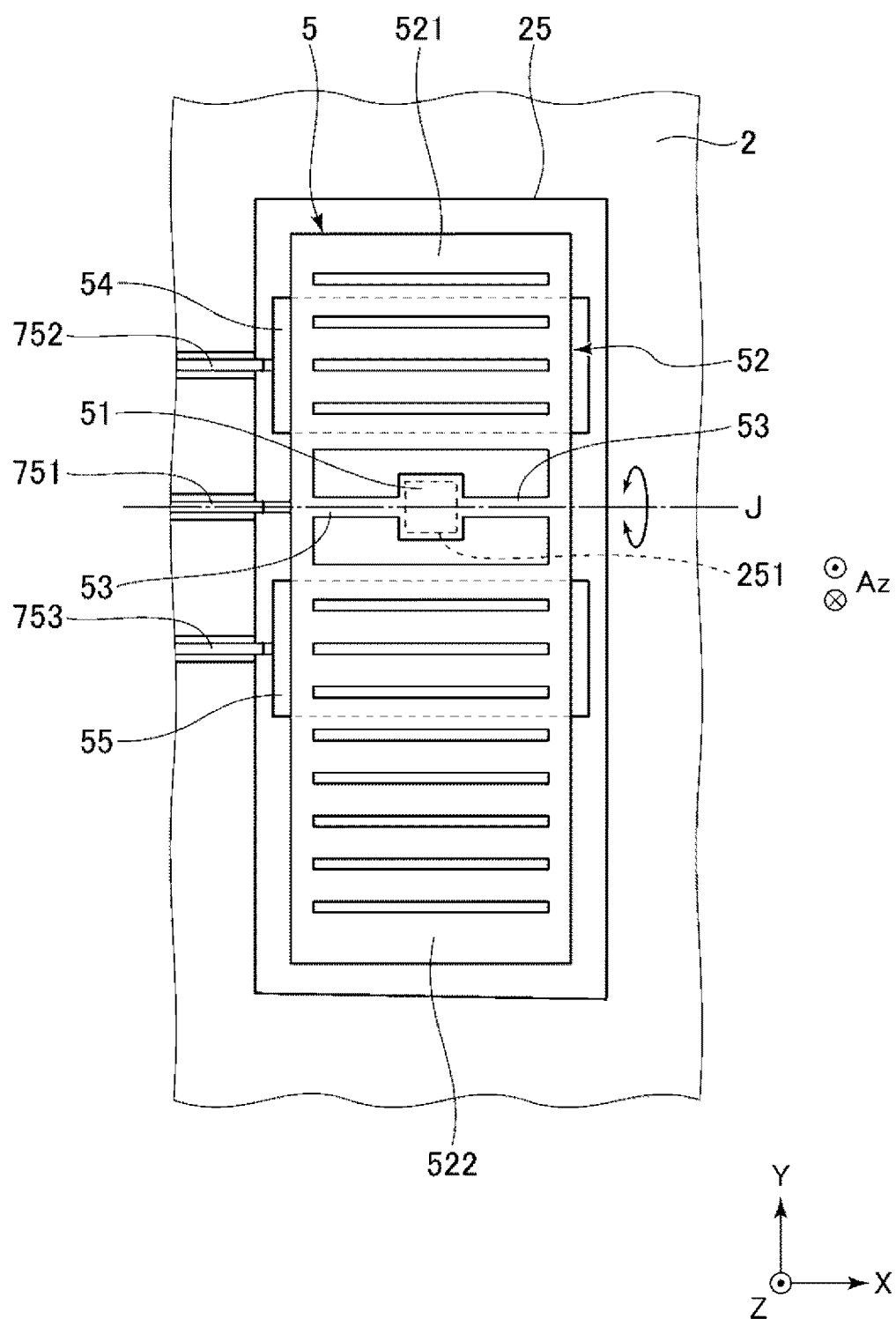
FIG. 6 is a plan view showing an example of a sensor device that detects acceleration in an axis-Z direction.
Figure 7:
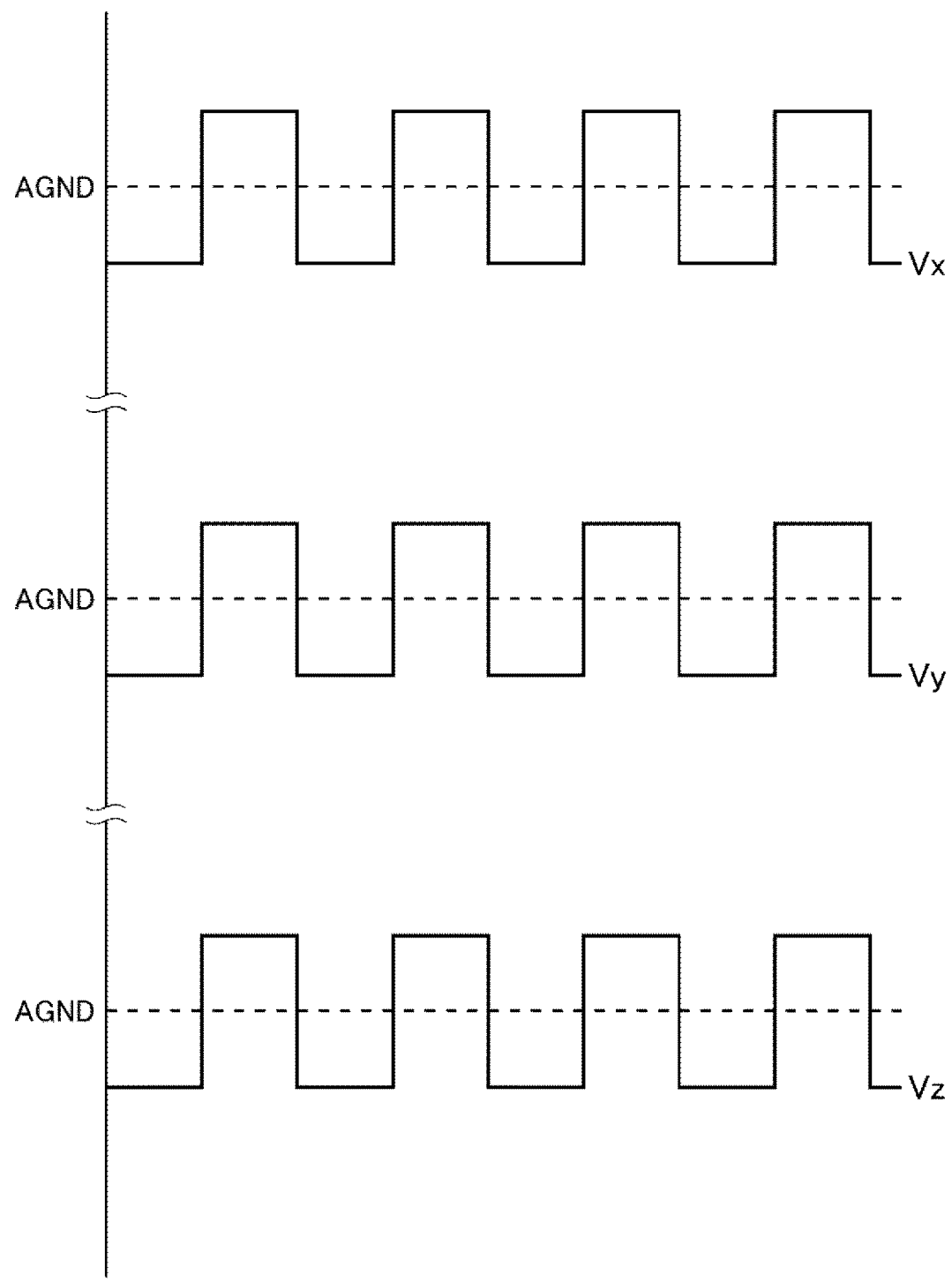
FIG. 7 shows an example of drive voltage applied to each of the sensor devices.
Figure 8:
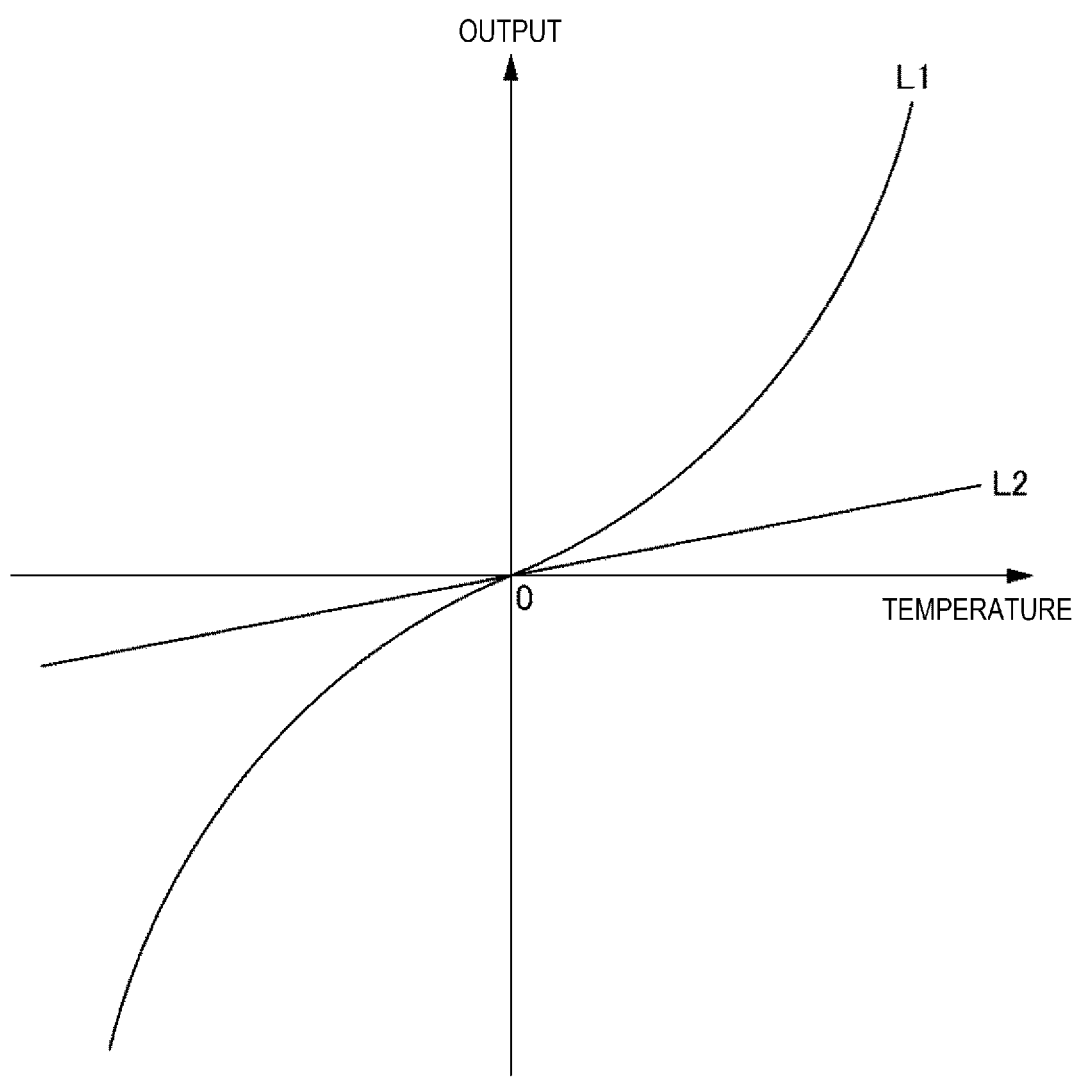
FIG. 8 shows graphs illustrating variation in the value of the output from the sensor main body versus temperature.
Figure 9:
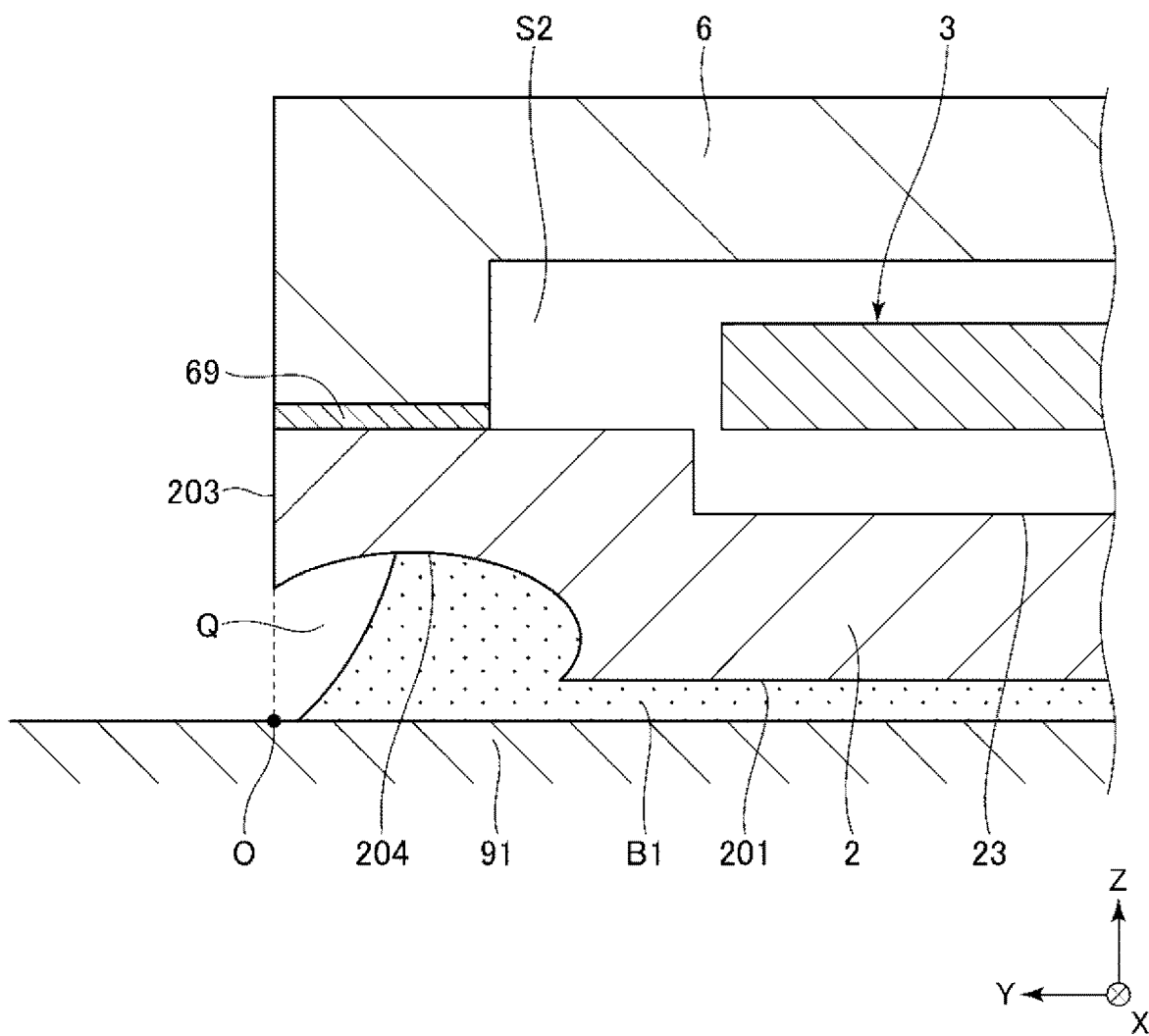
FIG. 9 is a cross-sectional view showing a variation of the sensor main body.
Figure 10:
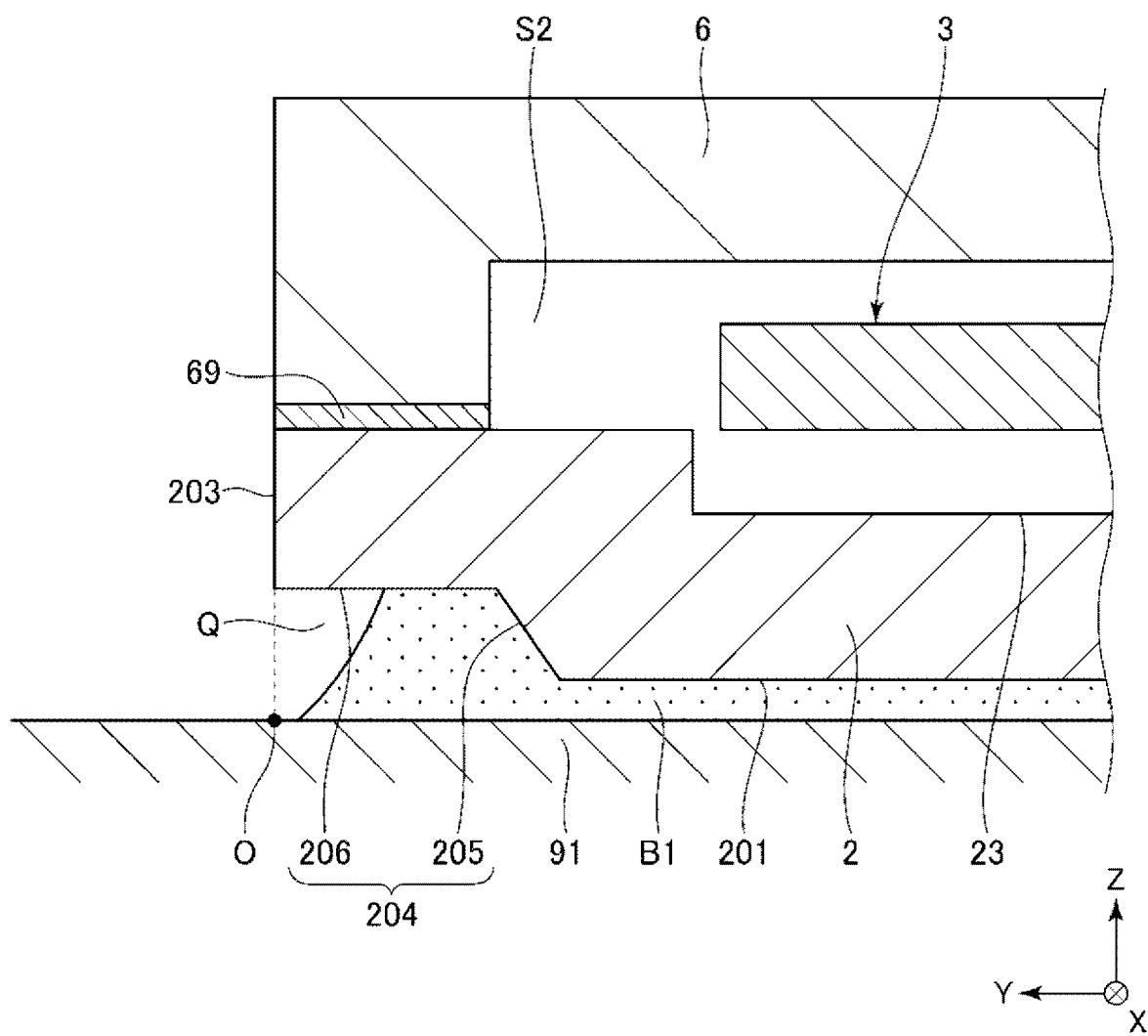
FIG. 10 is a cross-sectional view showing another variation of the sensor main body.
Figure 11:
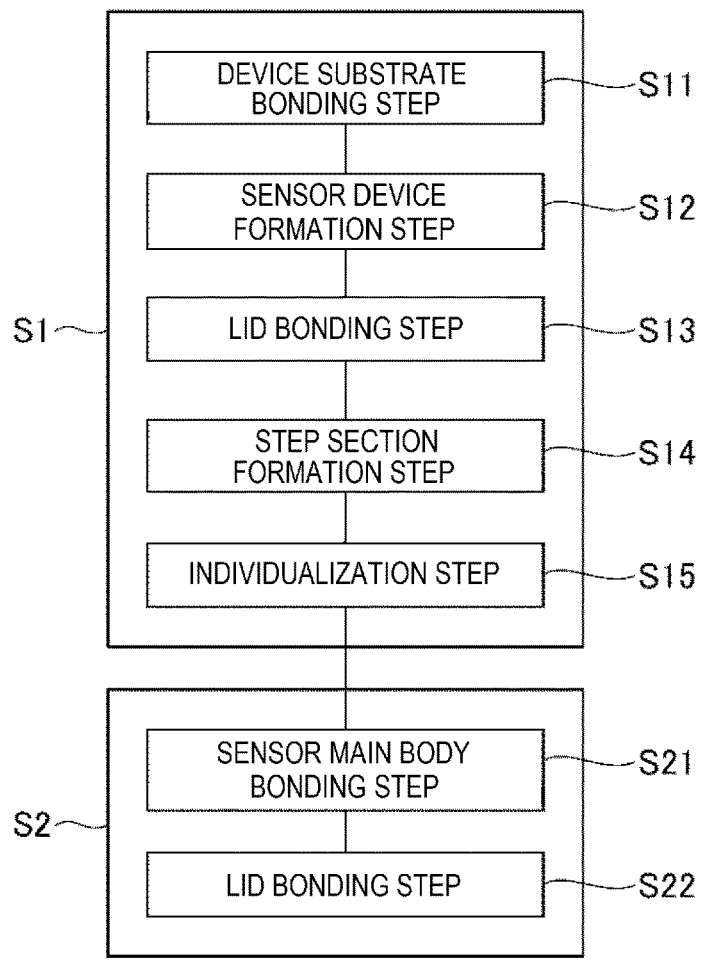
FIG. 11 shows the steps of manufacturing the inertial sensor shown in FIG. 1.

FIG. 1 is a cross-sectional view showing an inertial sensor according to a first embodiment. FIG. 2 is a plan view of a sensor main body of the inertial sensor shown in FIG. 1. FIG. 3 is a cross-sectional view of the sensor main body taken along the line A-A in FIG. 2. FIG. 4 is a plan view showing an example of a sensor device that detects acceleration in an axis-X direction. FIG. 5 is a plan view showing an example of a sensor device that detects acceleration in an axis-Y direction. FIG. 6 is a plan view showing an example of a sensor device that detects acceleration in an axis-Z direction. FIG. 7 shows an example of drive voltage applied to each of the sensor devices. FIG. 8 shows graphs illustrating variation in the value of the output from the sensor main body versus temperature. FIGS. 9 and 10 are each a cross-sectional view showing a variation of the sensor main body. FIG. 11 shows the steps of manufacturing the inertial sensor shown in FIG. 1. FIGS. 12 to 20 are each a cross-sectional view for describing a method for manufacturing the inertial sensor shown in FIG. 1.

FIGS. 1 to 6 show axes X, Y, and Z as three axes perpendicular to one another. The direction along the axis X, that is, the direction parallel to the axis X is also called an "axis-X direction," the direction along the axis Y, that is, the direction parallel to the axis Y is also called an "axis-Y direction," and the direction along the axis Z, that is, the direction parallel to the axis Z is also called an "axis-Z direction." The side facing the front end of the arrow of each of the axes is also called a "positive side," and the side opposite the positive side is also called a "negative side." The positive side of the axis-Z direction is also called "upper," and the negative side of the axis-Z direction is also called "lower." In the specification of the present application, the term "perpendicular" corresponds to a case where two lines intersect each other at 90° and also corresponds to a case where two lines intersect each other at an angle that slightly deviates from 90°, for example, at an angle that falls within 90°±5°.

An inertial sensor 1 shown in FIG. 1 is an acceleration sensor capable of detecting acceleration in each of the axis-X, axis-Y, and axis-Z directions perpendicular to one another independently of one another. The thus configured inertial sensor 1 includes a package 9, a sensor main body 10, and a circuit element 8, with the latter two accommodated in the package 9.

The package 9 includes a base 91, which serves as a support substrate and in which a recess 911, which opens via the upper surface of the base 91, is formed, and a lid 92, which is so bonded to the upper surface of the base 91 via a bonding member 93 as to close the opening of the recess 911. The recess 911 forms an internal space S in the package 9, and the sensor main body 10 and the circuit element 8 are accommodated in the internal space S.

The base 91 can be formed by layering a plurality of ceramic sheets made, for example, of alumina or a plurality of sheets made of borosilicate glass. The lid 92 can be made of a metal material, such as Kovar. It is, however, noted that the base 91 and the lid 92 are not necessarily each made of a specific material.

The internal space S is hermetically shielded and is under the atmospheric pressure. It is, however, noted that the internal space S does not necessarily have a specific atmosphere and may be, for example, under pressure higher or lower than the atmospheric pressure. In a case where the pressure lower than the atmospheric pressure is close to the vacuum pressure, the internal space S functions as a heat insulating layer and can suppress variation in temperature of the sensor main body 10. The detection characteristics of the sensor main body 10 are therefore improved.

The recess 911 is formed by layering punched ceramic sheets and includes a recess 911a, which opens via the upper surface of the base 91, and a recess 911b, which opens via the bottom surface of the recess 911a with the opening being narrower than the opening of the recess 911a. The sensor main body 10 is fixed to the bottom surface of the recess 911b via a bonding member B1. The bonding member B1 is not limited to a specific component and can, for example, be any of a variety of resin-based adhesives, such as epoxy-based, polyimide-based, acrylic, and silicone-based adhesives. To lower the influence of stress on the sensor main body 10, any of the variety of resin-based adhesives to be used preferably has a modulus of elasticity ranging from about 0.1 to 10 GPa and a coefficient of linear expansion ranging from about several to several hundreds of ppm.

A plurality of internal terminals 941 are provided on the bottom surface of the recess 911a, and a plurality of external terminals 943 are provided on the lower surface of the base 91. The internal terminals 941 and the external terminals 943 are electrically coupled to each other via wiring lines that are not shown but are formed in the base 91. The internal terminals 941 are electrically coupled to the circuit element 8 via bonding wires BW1.

The sensor main body 10 includes a substrate 2, which is bonded to the bottom surface of the recess 911b via the bonding member B1, three sensor devices 3, 4, and 5, which are provided on the side facing the upper side of the substrate 2, and a lid 6, which accommodates the sensor devices 3, 4, and 5 and is bonded to the substrate 2, as shown in FIGS. 1 and 2. The functions of the three sensor devices 3, 4, and 5 are as follows: the sensor device 3 detects acceleration Ax in the axis-X direction; the sensor device 4 detects acceleration Ay in the axis-Y direction, and the sensor device 5 detects acceleration Az in the axis-Z direction. In FIGS. 1 and 2, the sensor devices 3, 4, and 5 are drawn in a simplified manner for convenience of the description.

The configuration of the inertial sensor 1 is not limited to the configuration described above. For example, the arrangement, the shapes, the functions, and other factors of the sensor devices 3, 4, and 5 may differ from those shown in FIGS. 1 and 2. Further, for example, one or two of the sensor devices 3, 4, and 5 may be omitted. Moreover, in place of or in addition to the sensor devices 3, 4, and 5, a sensor device capable of detecting inertia excluding acceleration, for example, angular velocity may be used.

The substrate 2 has a rectangular shape, that is, a quadrangular shape in a plan view viewed along the axis-Z direction and specifically has an oblong shape having a pair of sides 2a and 2b, which extend in the axis-Y direction, and a pair of sides 2c and 2d, which extend in the axis-X direction, as shown in FIG. 2. It is, however, noted that the substrate 2 does not necessarily have a specific shape in the plan view and may have, for example, a polygonal, circular, or deformed shape other than a quadrangular shape.

The substrate 2 has a plate-like shape and has a lower surface 201, which serves as a first principal surface, an upper surface 202, which serves as a second principal surface and faces away from the lower surface 201, and a side surface 203, which connects the lower surface 201 and the upper surface 202 to each other, as shown in FIG. 3. The substrate 2 has three recesses 23, 24, and 25, which each open via the upper surface 202. Part of the sensor device 3 is so bonded to the upper surface of the substrate 2 as to overlap with the recess 23, part of the sensor device 4 is so bonded to the upper surface of the substrate 2 as to overlap with the recess 24, and part of the sensor device 5 is so bonded to the upper surface of the substrate 2 as to overlap with the recess 25. The recesses 23, 24, and 25 are configured to allow the sensor devices 3, 4, and 5 to be movable. The recesses 23, 24, and 25 may instead be integrated with one another into one recess.

The substrate 2 has grooves that each open via the upper surface 202, and wiring lines 731, 732, 733, 741, 742, 743, 751, 752, and 753 are provided in the grooves, as shown in FIG. 2. The wiring lines 731, 732, 733, 741, 742, 743, 751, 752, and 753 are so provided as to extend to the interior and exterior of an accommodation space SS. Among the wiring lines, the wiring lines 731, 732, and 733 are electrically coupled to the sensor device 3, the wiring lines 741, 742, and 743 are electrically coupled to the sensor device 4, and the wiring lines 751, 752, and 753 are electrically coupled to the sensor device 5.

One end portion of each of the wiring lines 731, 732, 733, 741, 742, 743, 751, 752, and 753 is exposed to the region out of the lid 6 and functions as an electrode pad P electrically coupled to an external apparatus. The nine electrode pads P are provided in the form of a single row along the side 2a of the substrate 2. The electrode pads P are then electrically coupled to the circuit element 8 via bonding wires BW2, as shown in FIG. 1.

The thus configured substrate 2 can, for example, be a glass substrate made, for example, of a glass material containing an alkali metal ion, such as the sodium ion, specifically, a glass substrate made of borosilicate glass, such as TEMPAX glass and PYREX glass (both are registered trademark). It is, however, noted that the substrate 2 is not necessarily made of a specific material and may, for example, be a silicon substrate or a ceramic substrate.

The lid 6 has a rectangular shape in the plan view and specifically has an oblong shape having a pair of sides 6a and 6b, which extend in the axis-Y direction, and a pair of sides 6c and 6d, which extend in the axis-X direction, as shown in FIG. 2. It is, however, noted that the lid 6 does not necessarily have a specific shape in the plan view and may have, for example, a polygonal, circular, or deformed shape other than a quadrangular shape. The lid 6 has a recess 61, which opens via the lower surface of the lid 6.

The lid 6 accommodates the sensor devices 3, 4, and 5 in the recess 61, which is formed in the lid 6, and is bonded to the upper surface of the substrate 2, as shown in FIG. 3. The lid 6 and the substrate 2 form the accommodation space SS, which hermetically accommodates the sensor devices 3, 4, and 5. A through hole 62, which causes the interior and exterior of the accommodation space SS to communicate with each other, is provided in the lid 6. After the accommodation space SS is caused to have a desired atmosphere via the through hole 62, the through hole 62 is filled with and closed by a sealing material 63.

It is preferable that the accommodation space SS is filled with an inert gas, such as nitrogen, helium, and argon, and that the temperature at which the inertial sensor 1 is used, for example, ranges from about −40° C. to +125° C. and the pressure of the gas that fills the accommodation space SS is substantially equal to the atmospheric pressure. Setting the pressure of the gas that fills the accommodation space SS at the atmospheric pressure allows an increase in viscous resistance to achieve a damping effect, whereby vibration of each of the sensor devices 3, 4, and 5 can be quickly settled. The detection accuracy of the inertial sensor 1 is thus be improved. In more detail, the pressure of the gas that fills the accommodation space SS can be adjusted in accordance with damping design of each of the sensor devices 3, 4, and 5 to a value ranging from about 0.1 to 2 barometric pressure, which is close to the atmospheric pressure.

The thus configured lid 6 can, for example, be a silicon substrate. It is, however, noted that the lid 6 is not necessarily made of a specific material and may, for example, be a glass substrate or a ceramic substrate. The method for bonding the substrate 2 and the lid 6 to each other is not limited to a specific method and may be selected as appropriate in accordance with the materials of the substrate 2 and the lid 6. In the present embodiment, the substrate 2 and the lid 6 are bonded to each other via a bonding member 69, which is formed over the entire circumference of the lower surface of the lid 6. The bonding member 69 can be made, for example, of a glass frit material, which is low-melting-point glass.

The sensor devices 3, 4, and 5 will next be described with reference to FIGS. 4 to 6. The sensor devices 3, 4, and 5 can be formed together, for example, by bonding a silicon substrate into which an impurity, such as phosphorus (P), boron (B), and arsenic (As), has been doped onto the upper surface of the substrate 2 in an anodic bonding process and patterning the silicon substrate in a Bosch process, which is a deep-groove etching technology. It is, however, noted that the method for forming the sensor devices 3, 4, and 5 is not limited to the method described above.

The sensor device 3 can detect acceleration Ax in the axis-X direction. The thus functioning sensor device 3 includes a fixed section 31, which is fixed to a mount 231, which protrudes from the bottom surface of the recess 23, a movable element 32, which is displaceable in the axis-X direction relative to the fixed section 31, springs 33 and 34, which link the fixed section 31 and the movable element 32 to each other, a first movable electrode 35 and a second movable electrode 36, with which the movable element 32 is provided, a first fixed electrode 38, which is fixed to amount 232, which protrudes from the bottom surface of the recess 23, and faces the first movable electrode 35, and a second fixed electrode 39, which is fixed to a mount 233, which protrudes from the bottom surface of the recess 23, and faces the second movable electrode 36, as shown in FIG. 4.

The first and second movable electrodes 35, 36 are electrically coupled to the wiring line 731 in the fixed section 31, the first fixed electrodes 38 is electrically coupled to the wiring line 732, and the second fixed electrodes 39 is electrically coupled to the wiring line 733. Drive voltage Vx, which is the combination of DC voltage and AC voltage superimposed on each other, as shown, for example, in FIG. 7, is applied to the first and second movable electrodes 35, 36. On the other hand, fixed voltage AGND (analog ground) is applied to the first and second fixed electrodes 38, 39, which are coupled to a charge amplifier via the corresponding electrode pads P. The fixed voltage AGND (analog ground) is center voltage at the center of the amplitude of the drive voltage Vx.

As a result, capacitance Cx1 is formed between the first movable electrode 35 and the first fixed electrode 38, and capacitance Cx2 is formed between the second movable electrode 36 and the second fixed electrode 39. When potential difference is created between the drive voltage Vx and the fixed voltage AGND, charge according to the potential difference is induced between the first movable electrode 35 and the first fixed electrode 38 and between the second movable electrode 36 and the second fixed electrode 39. When the amount of charge induced between the first movable electrode 35 and the first fixed electrode 38 is equal to the amount of charge induced between the second movable electrode 36 and the second fixed electrode 39, the value of voltage created at the charge amplifier is zero. This represents that the acceleration Ax acting on the sensor device 3 is zero (static state).

When the acceleration Ax acts on the sensor device 3 in the state in which the capacitance Cx1 and the capacitance Cx2 are formed, the movable element 32 is displaced in the axis-X direction, which causes the capacitance Cx1 and Cx2 to change in opposite phases. The amounts of charge induced between the first movable electrode 35 and the first fixed electrode 38 and between the second movable electrode 36 and the second fixed electrode 39 also therefore change based on the changes in the capacitance Cx1 and Cx2. A difference between the amount of charge induced between the first movable electrode 35 and the first fixed electrode 38 and the amount of charge induced between the second movable electrode 36 and the second fixed electrode 39 is outputted as the value of the voltage at the charge amplifier. The acceleration Ax acting on the sensor device 3 can therefore be determined based on the value of the voltage outputted from the charge amplifier.

The sensor device 4 can detect acceleration Ay in the axis-Y direction. The thus functioning sensor device 4 can, for example, be the sensor device 3 described above but rotated by 90 degrees around the axis Z, as shown in FIG. 5. That is, the sensor device 4 includes a fixed section 41, which is fixed to amount 241, which protrudes from the bottom surface of the recess 24, a movable element 42, which is displaceable in the axis-Y direction relative to the fixed section 41, springs 43 and 44, which link the fixed section 41 and the movable element 42 to each other, a first movable electrode 45 and a second movable electrode 46, with which the movable element 42 is provided, a first fixed electrode 48, which is fixed to a mount 242, which protrudes from the bottom surface of the recess 24, and faces the first movable electrode 45, and a second fixed electrode 49, which is fixed to a mount 243, which protrudes from the bottom surface of the recess 24, and faces the second movable electrode 46, as shown in FIG. 5.

The first and second movable electrodes 45, 46 are electrically coupled to the wiring line 741 in the fixed section 41, the first fixed electrodes 48 is electrically coupled to the wiring line 742, and the second fixed electrodes 49 is electrically coupled to the wiring line 743. Drive voltage Vy, which is the combination of DC voltage and AC voltage superimposed on each other, as shown, for example, in FIG. 7, is applied to the first and second movable electrodes 45, 46. On the other hand, the fixed voltage AGND (analog ground) is applied to the first and second fixed electrodes 48, 49, which are coupled to a charge amplifier via the corresponding electrode pads P. The fixed voltage AGND (analog ground) is center voltage at the center of the amplitude of the drive voltage Vy.

As a result, capacitance Cy1 is formed between the first movable electrode 45 and the first fixed electrode 48, and capacitance Cy2 is formed between the second movable electrode 46 and the second fixed electrode 49. When potential difference is created between the drive voltage Vy and the fixed voltage AGND, charge according to the potential difference is induced between the first movable electrode 45 and the first fixed electrode 48 and between the second movable electrode 46 and the second fixed electrode 49. When the amount of charge induced between the first movable electrode 45 and the first fixed electrode 48 is equal to the amount of charge induced between the second movable electrode 46 and the second fixed electrode 49, the value of voltage created at the charge amplifier is zero. This represents that the acceleration Ay acting on the sensor device 4 is zero (static state).

When the acceleration Ay acts on the sensor device 4 in the state in which the capacitance Cy1 and the capacitance Cy2 are formed, the movable element 42 is displaced in the axis-Y direction, which causes the capacitance Cy1 and Cy2 to change in opposite phases. The amounts of charge induced between the first movable electrode 45 and the first fixed electrode 48 and between the second movable electrode 46 and the second fixed electrode 49 also therefore change based on the changes in the capacitance Cy1 and Cy2. A difference between the amount of charge induced between the first movable electrode 45 and the first fixed electrode 48 and the amount of charge induced between the second movable electrode 46 and the second fixed electrode 49 is outputted as the value of the voltage at the charge amplifier. The acceleration Ay acting on the sensor device 4 can therefore be determined based on the value of the voltage outputted from the charge amplifier.

The sensor device 5 can detect acceleration Az in the axis-Z direction. The thus functioning sensor device 5 includes a fixed section 51, which is fixed to a mount 251, which protrudes from the bottom surface of the recess 25, and a movable element 52, which is coupled to the fixed section 51 via a beam 53 and swingable relative to the fixed section 51 around an axis of swing motion J along the axis X, as shown in FIG. 6. The movable element 52 includes a first movable section 521, which is located on one side of the axis of swing motion J, and a second movable section 522, which is located on the other side of the axis of swing motion J, and the rotational moment acting on the first movable section 521 around the axis of swing motion J differs from the rotational moment acting on the second movable section 522 around the axis of swing motion J. A first fixed electrode 54, which faces the first movable section 521, and a second fixed electrode 55, which faces the second movable section 522, are provided on the bottom surface of the recess 25.

The moveable element 52 is electrically coupled to the wiring line 751 in the fixed section 51, the first fixed electrodes 54 is electrically coupled to the wiring line 752, and the second fixed electrodes 55 is electrically coupled to the wiring line 753. Drive voltage Vz, which is the combination of DC voltage and AC voltage superimposed on each other, as shown, for example, in FIG. 7, is applied to the movable element 52 via the corresponding electrode pad P. On the other hand, the fixed voltage AGND (analog ground) is applied to the first and second fixed electrodes 54, 55, which are coupled to a charge amplifier via the corresponding electrode pads P. The fixed voltage AGND (analog ground) is center voltage at the center of the amplitude of the drive voltage Vz.

As a result, capacitance Cz1 is formed between the first movable section 521 and the first fixed electrode 54, and capacitance Cz2 is formed between the second movable section 522 and the second fixed electrode 55. When potential difference is created between the drive voltage Vz and the fixed voltage AGND, charge according to the potential difference is induced between the first movable section 521 and the first fixed electrode 54 and between the second movable section 522 and the second fixed electrode 55. When the amount of charge induced between the first movable section 521 and the first fixed electrode 54 is equal to the amount of charge induced between the second movable section 522 and the second fixed electrode 55, the value of voltage created at the charge amplifier is zero. This represents that the acceleration Az acting on the sensor device 5 is zero (static state).

When the acceleration Az acts on the sensor device 5 in the state in which the capacitance Cz1 and the capacitance Cz2 are formed, the movable element 52 is displaced in the axis of swing motion J, which causes the capacitance Cz1 and Cz2 to change in opposite phases. The amounts of charge induced between the first movable section 521 and the first fixed electrode 54 and between the second movable section 522 and the second fixed electrode 55 also therefore change based on the changes in the capacitance Cz1 and Cz2. A difference between the amount of charge induced between the first movable element 521 and the first fixed electrode 54 and the amount of charge induced between the second movable element 522 and the second fixed electrode 55 is outputted as the value of the voltage at the charge amplifier. The acceleration Az acting on the sensor device 5 can therefore be determined based on the value of the voltage outputted from the charge amplifier.

The sensor devices 3, 4, and 5 have been described above, and the configurations of the sensor devices 3, 4, and 5 are not limited to specific configurations and may be any configurations capable of detecting the acceleration Ax, Ay, and Az.

Referring back to the description of the substrate 2, a recessed step section 204 is formed in the substrate 2, and the recessed step section 204 is located between the side surface 203 and the lower surface 201 and connects the side surface 203 and the lower surface 201 to each other, as shown in FIG. 3. The step section 204 has a ring shape along the entire circumference of the substrate 2. The step section 204 is so processed as to have an L-letter-shaped cross section and has a first surface 205, which extends from the outer edge of the lower surface 201 in the axis-Z direction, and a second surface 206, which extends from the lower end of the side surface 203 in the direction of the plane X-Y and is connected to the first surface 205. In other words, the substrate 2 has the lower surface 201, which serves as the first principal surface, the upper surface 202, which serves as the second principal surface and faces away from the lower surface 201, the bottom surfaces of the recesses 23, 24, and 25 that are parallel to the first principal surface, and the second surface 206, which is also parallel to the first principal surface. The substrate 2 further has the side surface 203 and the first surface 205, which is parallel to the side surface 203. When the substrate 2 is made of a glass material, in particular, the substrate 2 can be readily processed and formed as described above at low cost.

The bonding member B1, which bonds the substrate 2 to the base 91, is so provided as to extend along the lower surface 201 and the step section 204. That is, the bonding member B1 is in contact with the lower surface 201 and the step section 204 but is not in contact with the side surface 203. Providing the substrate 2 with the step section 204 as described above allows formation of a space Q, which causes the bonding member B1 to stay in the region between the step section 204 and the base 91, which effectively prevents the bonding member B1 from spreading outward. The state in which the bonding member B1 rises in the form of a fillet along the side surface 203 can therefore be effectively suppressed, unlike in the related art. As a result, stress induced in accordance with the difference in coefficient of thermal expansion between the bonding member B1 and the substrate 2 is effectively distributed over the substrate 2 and is therefore unlikely to be transmitted to the upper surface 202 of the substrate 2. The reason for this is that no fillet portion around the substrate 2 presses or pulls the substrate 2. When the bonding member B1 is made of a solder-based fixing material primarily containing solder, thermal stress concentrates in the step section 204 and is likely to cause the substrate 2 to crack or chip. This could result in malfunction of the sensor devices 3, 4, and 5 and a decrease in long-term reliability thereof. The bonding member B1 is therefore preferably a resin-based adhesive having low elasticity. It is particularly preferable to use a resin-based adhesive having a modulus of elasticity ranging from about 0.1 to 10 GPa and a coefficient of thermal expansion ranging from about several to several hundreds of ppm. Further, the substrate 2 is preferably made of an amorphous glass material.

Since the sensor devices 3, 4, and 5 are provided on the upper surface 202, the stress is unlikely to be transmitted to the upper surface 202 and is therefore unlikely to be transmitted to the sensor devices 3, 4, and 5. Therefore, the sensor device 3 can effectively suppress unintended changes in the gap between the first movable electrode 35 and the first fixed electrode 38 and between the second movable electrode 36 and the second fixed electrode 39 (changes due to force other than acceleration Ax). The sensor device 4 can effectively suppress unintended changes in the gap between the first movable electrode 45 and the first fixed electrode 48 and between the second movable electrode 46 and the second fixed electrode 49 (changes due to force other than acceleration Ay). The sensor device 5 can effectively suppress unintended changes in the gap between the first movable section 521 and the first fixed electrode 54 and between the second movable section 522 and the second fixed electrode 55 (changes due to force other than acceleration Az).

As a result, variation of the value of the output from the inertial sensor 1 due to the thermal stress is suppressed, whereby the inertial sensor 1 can more accurately detect the acceleration Ax, Ay, and Az. FIG. 8 shows graphs illustrating variation in the value of the output from the sensor main body 10 versus temperature. In the configuration in which the bonding member B1 rises along the side surface 203 as in the related art, the value of the output from the inertial sensor 1 nonlinearly changes in the form of a quadratic function or a cubic function versus temperature, as indicated by the line L1, whereas in the configuration in which the bonding member B1 does not rise along the side surface 203 as in the present embodiment, the value of the output from the inertial sensor 1 linearly changes in the form of a linear function versus temperature, as indicated by the line L2. Therefore, the output value varies at a fixed rate and varies only by a small amount, and the degree of hysteresis can further be reduced. The circuit element 8 can therefore accurately perform temperature correction, whereby the inertial sensor 1 can more accurately detect the acceleration Ax, Ay, and Az even when the temperature around the inertial sensor 1 changes.

In particular, in the present embodiment, the bonding member B1 is so provided as to extend to the second surface 206 of the step section 204, as shown in FIG. 3. That is, the bonding member B1 is so provided as to be in contact with the lower surface 201, the first surface 205, and the second surface 206. The area over which the substrate 2 is bonded to the bonding member B1 therefore increases, whereby the bonding strength therebetween can be further increased.

Further, in the present embodiment, the bottom surfaces of the recesses 23, 24, and 25 are shifted from the step section 204 upward, that is, toward the upper surface 202. The height H of the step section 204 is therefore suppressed to a small value, whereby a decrease in mechanical strength of the substrate 2 can be suppressed. It is, however, noted that the configuration described above is not necessarily employed, and the bottom surfaces of the recesses 23, 24, and 25 may be shifted from the step section 204 downward, that is, toward the lower surface 201. The height H of the step section 204 is not limited to a specific value, and H/H2 is preferably greater than or equal to about ⅙ but smaller than or equal to about ⅓, where H2 is the thickness of the substrate 2. That is, when the thickness H2 of the substrate 2 is 300 µm, the height H is preferably greater than or equal to about 50 µm but smaller than or equal to about 100 µm. As a result, the height H of the step section 204 can be suppressed to a small value with a sufficiently large space Q provided, whereby a decrease in mechanical strength of the substrate 2 can be more effectively suppressed.

Further, in the present embodiment, the step section 204 is provided between the recesses 23, 24, 25 and the side surface 203 in the plan view viewed along the axis-Z direction. That is, the step section 204 does not overlap with the recess 23, 24, or 25 but is located in a position outside the recesses 23, 24, and 25 in the plan view viewed along the axis-Z direction. As a result, the width W of the step section 204 is suppressed to a small value, whereby a decrease in mechanical strength of the substrate 2 can be suppressed.

In the present embodiment, the entire circumference of the step section 204 is located in a position outside the recesses 23, 24, and 25, but not necessarily, and at least part of the entire circumference of the step section 204 only needs to be located in a position outside the recesses 23, 24, and 25. In this case, at least 50% of the entire circumference of the step section 204 is preferably located in a position outside the recesses 23, 24, and 25, at least 80% of the entire circumference of the step section 204 is more preferably located in a position outside the recesses 23, 24, and 25, and at least 90% of the entire circumference of the step section 204 is still more preferably located in a position outside the recesses 23, 24, and 25.

The step section 204 described above can be formed by half dicing using a dicing saw, as will be described later. The half dicing allows the step section 204 to be readily formed. The dicing saw roughens the surface of the step section 204 to form minute irregularities on the surface. An anchor effect is thus achieved, whereby the bonding strength between the substrate 2 and the bonding member B1 can be increased. In particular, when the substrate 2 is made of a glass material, irregularities became remarkable because the glass material is an amorphous material, whereby the bonding strength between the substrate 2 and the bonding member B1 can be increased. It is, however, noted that the method for forming the step section 204 is not limited to a specific method and may be formed, for example, by wet etching. In this case, since the substrate 2 is etched isometrically, the step section 204 has the shape shown in FIG. 9. When the substrate 2 is, for example, a silicon substrate, the step section 204 may be formed by wet etching. When the substrate 2 is a silicon wafer having the crystal plane (100), the crystal plane (111) of silicon is exposed, and the first surface 205 inclines with respect to the axis Z, as shown in FIG. 10.

The circuit element 8 is bonded to the upper surface of the sensor main body 10 via a bonding member B2. The circuit element 8 includes a drive circuit 81, which applies the drive voltage Vx, Vy, and Vz to the sensor devices 3, 4, and 5, respectively, and a detection circuit 82, which detects the acceleration Ax, Ay, and Az based on signals outputted from the sensor main body 10.

The inertial sensor 1 has been described. The inertial sensor 1 includes the base 91, which serves as the support substrate, the sensor main body 10, which is supported by the base 91, and the bonding member B1, which is located between the base 91 and the sensor main body 10 and bonds the sensor main body 10 to the base 91. The sensor main body 10 includes the substrate 2, which is bonded to the base 91 via the bonding member B1, and the capacitance-type sensor devices 3, 4, and 5, which are provided at a side of the substrate 2 that is the side opposite the base 91. The substrate 2 has the side surface 203, the lower surface 201, which is the first principal surface and faces the base 91, and the recessed step section 204, which is located between the side surface 203 and the lower surface 201 and connects the side surface 203 to the lower surface 201. The bonding member B1 extends along the lower surface 201 and the step section 204.

Providing the substrate 2 with the step section 204 as described above allows formation of the space Q, which causes the bonding member B1 to stay in the region between the step section 204 and the base 91, which effectively prevents the bonding member B1 from spreading outward. The state in which the bonding member B1 rises in the form of a fillet along the side surface 203 can therefore be effectively suppressed. As a result, stress induced in accordance with the difference in coefficient of thermal expansion between the bonding member B1 and the substrate 2 is effectively distributed and is therefore unlikely to be transmitted to the upper surface 202 of the substrate 2. Since the sensor devices 3, 4, and 5 are provided on the side facing the upper surface 202, the stress is unlikely to be transmitted to the upper surface 202 and is therefore unlikely to be transmitted to the sensor devices 3, 4, and 5. Variation of the value of the output from the inertial sensor 1 due to the stress is therefore suppressed, whereby the inertial sensor 1 can accurately detect the acceleration Ax, Ay, and Az.

The bonding member B1 is not in contact with the side surface 203, as described above. As a result, stress induced in accordance with the difference in coefficient of thermal expansion between the bonding member B1 and the substrate 2 is effectively distributed and is therefore unlikely to be transmitted to the upper surface 202 of the substrate 2. Variation of the value of the output from the inertial sensor 1 due to the stress is therefore suppressed by a greater degree, whereby the inertial sensor 1 can more accurately detect the acceleration Ax, Ay, and Az.

Further, the substrate 2 has the recesses 23, 24, and 25, which are provided in the upper surface 202, which faces away from the lower surface 201 and serves as the second principal surface located on the side facing the movable elements 32, 42, and 52, in such a way that the recesses 23, 24, and 25 overlap with the movable elements 32, 42, and 52 in the plan view viewed along the axis-Z direction, and the bottom surfaces of the recesses 23, 24, and 25 are shifted from the step section 204 toward the upper surface 202, as described above. The height H of the step section 204 can therefore be suppressed to a small value, whereby a decrease in mechanical strength of the substrate 2 can be suppressed.

Further, the step section 204 is provided between the recesses 23, 24, 25 and the side surface 203 in the plan view, as described above. That is, the step section 204 does not overlap with the recess 23, 24, or 25 but is located in a position outside the recesses 23, 24, and 25 in the plan view viewed along the axis-Z direction. As a result, the width W of the step section 204 is suppressed to a small value, whereby a decrease in mechanical strength of the substrate 2 can be suppressed.

A method for manufacturing the inertial sensor 1 described above will next be described. The method for manufacturing the inertial sensor 1 includes a sensor main body formation step S1 of forming the sensor main body 10 and an accommodation step S2 of accommodating the sensor main body 10 in the package 9, as shown in FIG. 11. The sensor main body formation step S1 includes a device substrate bonding step S11 of bonding a device substrate 100 to the upper surface 202 of the substrate 2 having the lower surface 201 and the upper surface 202, which face away from each other, a sensor device formation step S12 of forming the sensor devices 3, 4, and 5 from the device substrate 100, a lid bonding step S13 of bonding the lid 6 to the upper surface 202 of the substrate 2 to cover the sensor devices 3, 4, and 5, a step section formation step S14 of forming the recessed step section 204 in the region between the lower surface 201 and the side surface 203 of the substrate 2, and an individualization step S15. The accommodation step S2 includes a sensor main body bonding step S21 of bonding the substrate 2 to the base 91 via the bonding member B1 and a lid bonding step S22 of bonding the lid 92 to the base 91 to cover the sensor main body 10. The steps will be sequentially described below.

Device Substrate Bonding Step S11

Figure 12:
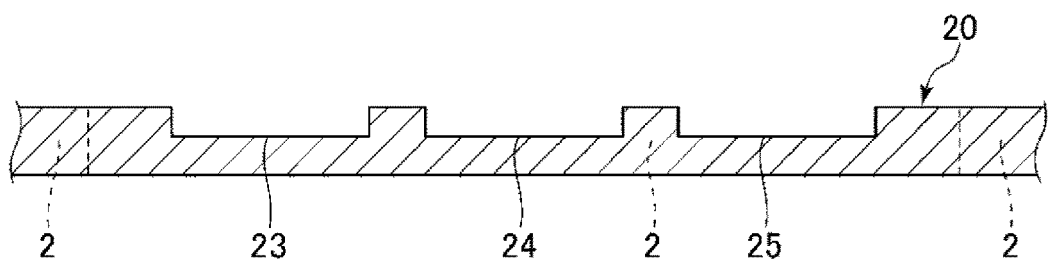
FIG. 12 is a cross-sectional view for describing a method for manufacturing the inertial sensor shown in FIG. 1.

A glass substrate 20 formed of a plurality of substrates 2 integrated with each other is first prepared, as shown in FIG. 12. The recesses 23, 24, and 25, the mounts 231, 232, 233, 241, 242, 243, and 251, and the grooves are then formed in each of the substrates 2. The recesses, mounts, and grooves can be formed, for example, by a variety of types of etching, such as wet etching and dry etching. The wiring lines 731, 732, 733, 741, 742, 743, 751, 752, and 753 are then formed in the grooves, and the first and second fixed electrodes 54, 55 are formed on the bottom surface of the recess 25.

Figure 13:
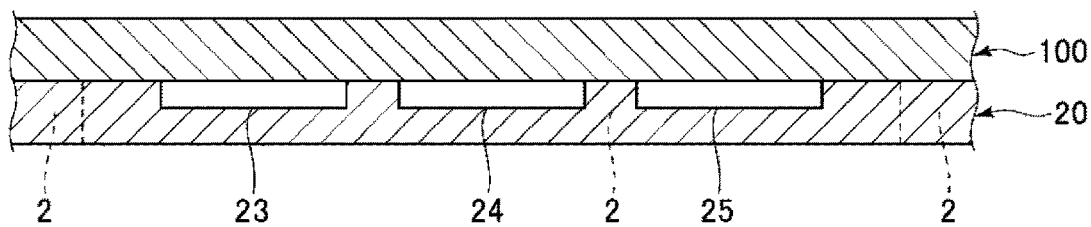
FIG. 13 is a cross-sectional view for describing the method for manufacturing the inertial sensor shown in FIG. 1.

The device substrate 100, which is formed of a silicon substrate and serves as a base material of the sensor devices 3, 4, and 5, is then prepared and bonded to the upper surface of the glass substrate 20, as shown in FIG. 13. The method for bonding the device substrate 100 to the glass substrate 20 is not limited to a specific method and is an anodic bonding method in the present embodiment. The device substrate 100 is then thinned as required by using chemical-mechanical polishing (CMP), and an impurity, such as phosphorus (P), boron (B), and arsenic (As), is then doped (diffused) into the device substrate 100 to impart electric conductivity to the device substrate 100. The timing when the impurity is doped is not limited to a specific timing and may be a timing before the device substrate 100 is thinned or before the device substrate 100 is bonded.

Sensor Device Formation Step S12

Figure 14:
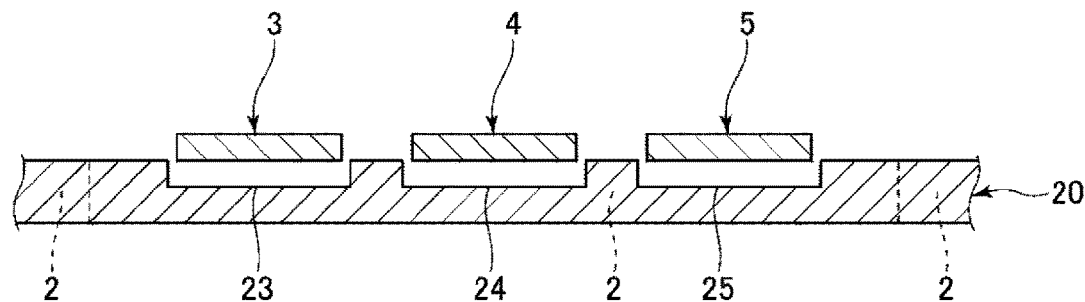
FIG. 14 is a cross-sectional view for describing the method for manufacturing the inertial sensor shown in FIG. 1.

The device substrate 100 is then dry-etched via a hard mask that is not shown to form the sensor devices 3, 4, and 5 from the device substrate 100, as shown in FIG. 14. The dry etching method is not limited to a specific method and is a dry Bosch method, which is the combination of an etching process using a reactive plasma gas and a deposition process, in the present embodiment.

Lid Bonding Step S13

Figure 15:
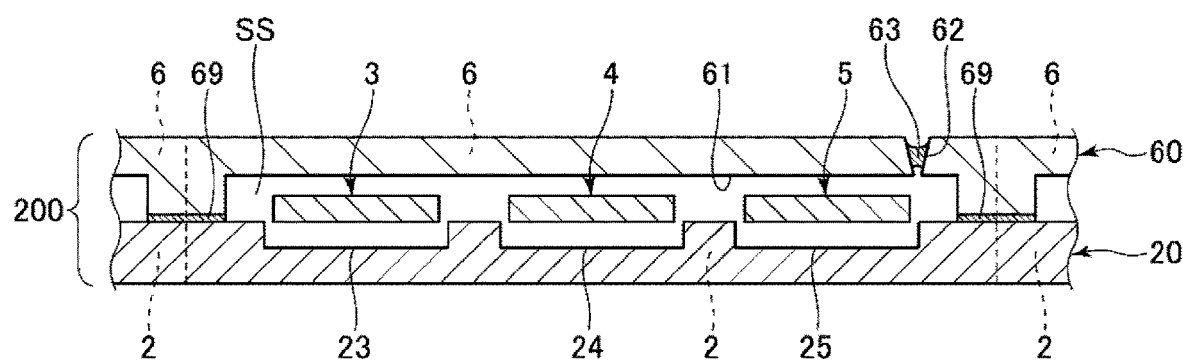
FIG. 15 is a cross-sectional view for describing the method for manufacturing the inertial sensor shown in FIG. 1.

A lid substrate 60 formed of a plurality of lids 6 integrated with each other is then prepared, and the lid substrate 60 is bonded to the upper surface of the glass substrate 20 via the bonding member 69 made of glass frit, as shown in FIG. 15. The accommodation spaces SS are then caused to have a desired atmosphere via the through holes 62, and the through holes 62 are then filled with the sealing material 63. The laminate of the glass substrate 20 and the lid substrate 60 is hereinafter also referred to as a layered substrate 200.

Step Section Formation Step S14

Figure 16:
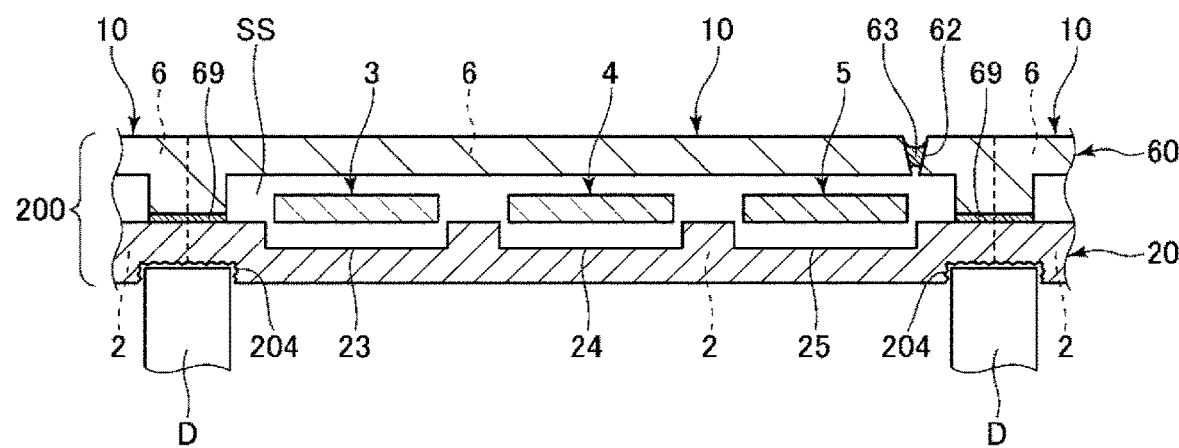
FIG. 16 is a cross-sectional view for describing the method for manufacturing the inertial sensor shown in FIG. 1.

A dicing saw D is then used to perform half dicing on the lower surface of the glass substrate 20 along the outer edge of each of the substrates 2 to form the step sections 204, as shown in FIG. 16. A plurality of sensor main bodies 10 are thus integrally formed in the layered substrate 200. Using the half dicing as described above readily allows formation of the step section 204 in each of the substrates 2. The dicing saw D roughens the surface of each of the step sections 204 to form minute irregularities on the surface. An anchor effect is thus achieved, whereby the bonding strength between the substrates 2 and the bonding member B1 can be increased. The half dicing may be performed once or multiple times. For example, a dicing saw having a width of 300 μm may be used once to form each of the steps 204, or a dicing saw having a width of 100 μm may be used three to four times to form each of the steps 204. The method for forming the steps 204 is not limited to a specific method and may be formed by using wet etching, dry etching, or any other type of etching.

Individualization Step S15

Figure 17:
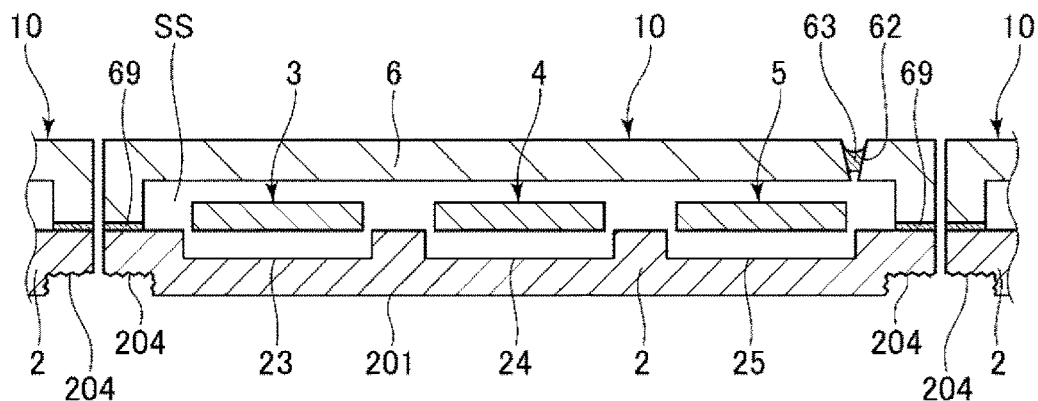
FIG. 17 is a cross-sectional view for describing the method for manufacturing the inertial sensor shown in FIG. 1.

The layered substrate 200 is then individualized into the plurality of sensor main bodies 10, as shown in FIG. 17. The sensor main bodies 10 are thus produced. In this process, to perform dicing again in the individualization step, a dicing saw having a width smaller than that of the dicing saw used in the half dicing may be used. For example, a dicing saw having a width of about 80 μm can be used. It is, however, noted that the individualization method is not limited to a specific method and may, for example, be a laser dicing method.

Sensor Main Body Bonding Step S21

Figure 18:
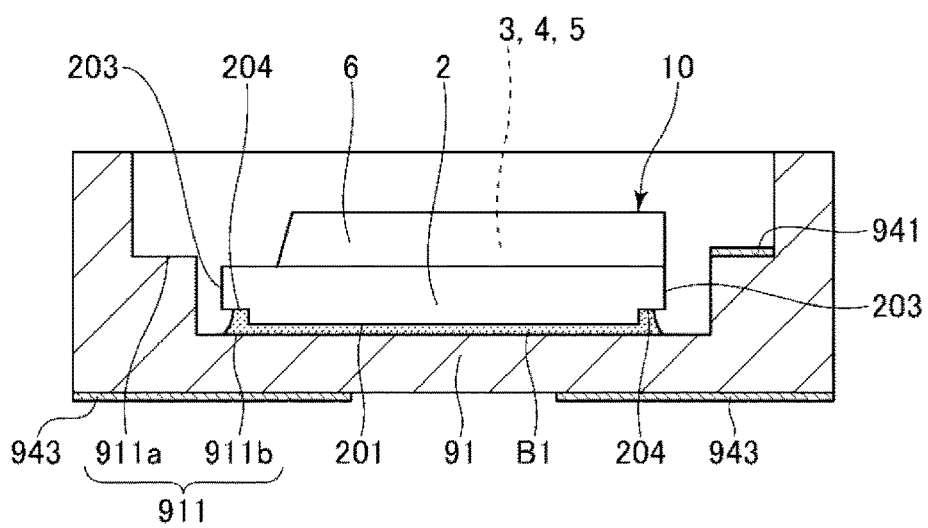
FIG. 18 is a cross-sectional view for describing the method for manufacturing the inertial sensor shown in FIG. 1.

The base 91 is then prepared, and the sensor main body 10 is bonded to the bottom surface of the recess 911 via the bonding member B1, as shown in FIG. 18. In this process, the bonding member B1 is caused to extend along the lower surface 201 of the substrate 2 and the step section 204.

Lid Bonding Step S22

Figure 19:
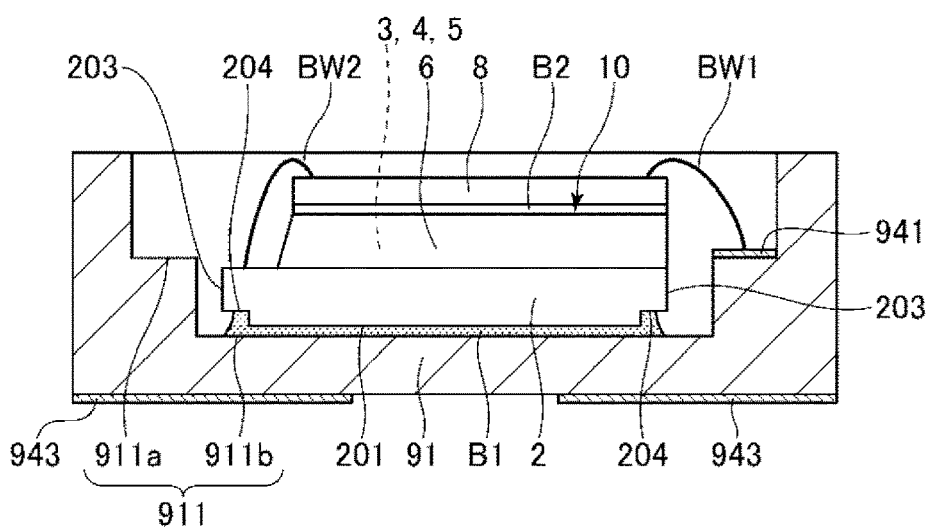
FIG. 19 is a cross-sectional view for describing the method for manufacturing the inertial sensor shown in FIG. 1.
Figure 20:
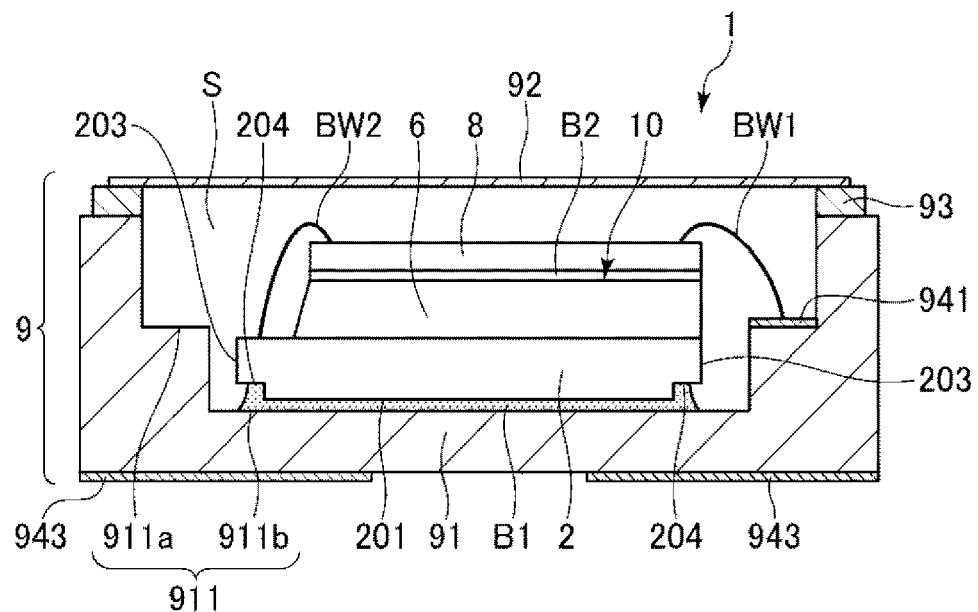
FIG. 20 is a cross-sectional view for describing the method for manufacturing the inertial sensor shown in FIG. 1.

The circuit element 8 is then bonded to the upper surface of the sensor main body 10 via the bonding member B2, as shown in FIG. 19. The circuit element 8 is then electrically coupled to the sensor main body 10 via the bonding wires BW2, and the circuit element 8 is electrically coupled to the internal terminals 941 via the bonding wires BW1. The lid 92 is then bonded to the upper surface of the base 91 via a bonding member 93, as shown in FIG. 20. The inertial sensor 1 is thus produced.

Figure 21:
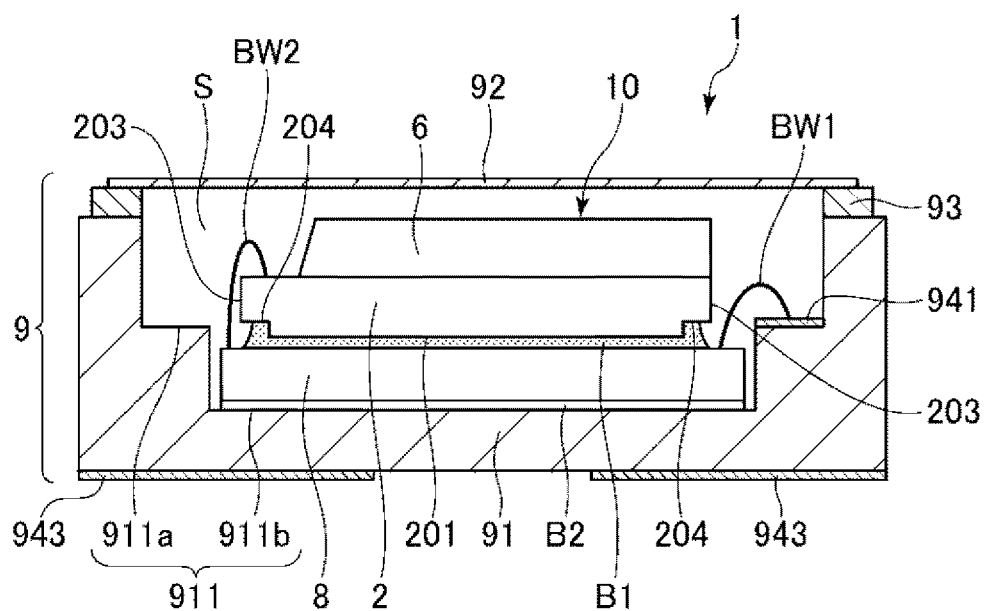
FIG. 21 is a cross-sectional view showing an example of the inertial sensor according to the first embodiment.

When the circuit element 8 is larger than the sensor main body 10, the sensor main body 10 can be bonded to the upper surface of the circuit element 8 via the bonding member B2, as shown in FIG. 21. Further, when the modulus of elasticity of the substrate 2, which forms the sensor main body 10, is smaller than the modulus of elasticity of the circuit element 8, the sensor main body 10 is preferably bonded to the upper surface of the circuit element 8 via the bonding member B2. In this configuration, the bonding member B1 preferably has a smaller modulus of elasticity, for example, a modulus of elasticity ranging from 0.1 to 5.0 GPa. The configuration described above can suppress the amount of variation in the value of the output from the inertial sensor 1 with the bonding strength between the substrate 2 and the bonding member B1 increased and can further reduce the degree of hysteresis.

Figure 22:
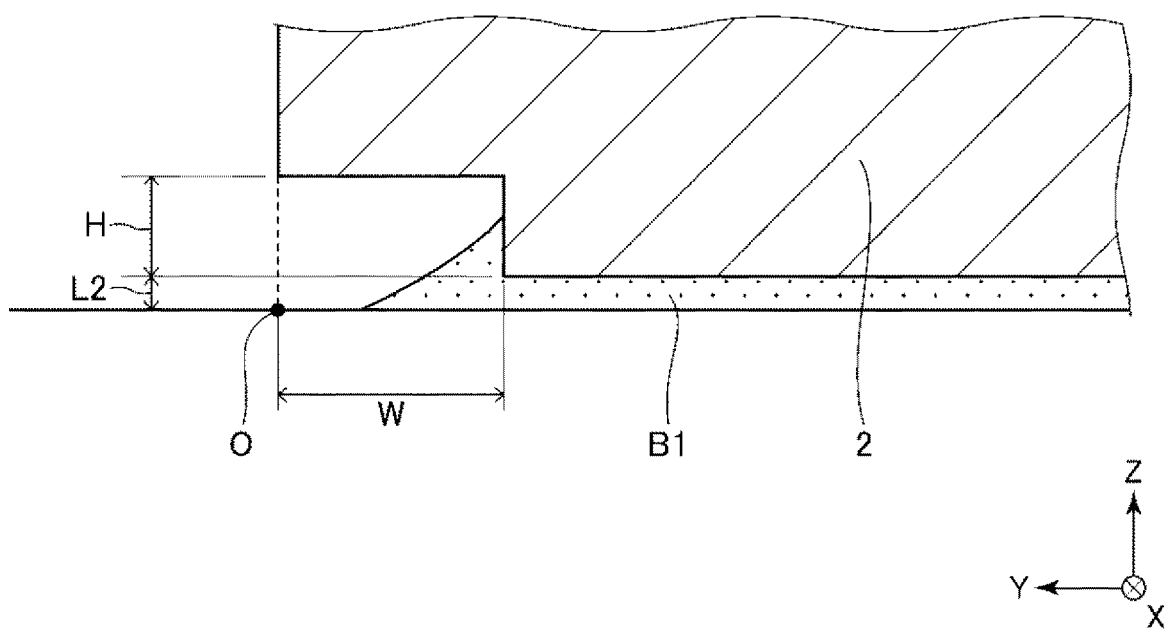
FIG. 22 is an enlarged view of a cross section of the inertial sensor shown in FIG. 21.

In the configuration shown in FIG. 21, employing a configuration in which the bonding member B1 does not extend beyond an intersection O of an imaginary extension of the side surface 203 and the base 91 allows a bonding region for the circuit element 8 to be ensured, as shown in FIG. 22, whereby the electrical coupling of the sensor main body 10 to the circuit element 8 and the electrical coupling of the circuit element 8 to the internal terminals 941 can be satisfactorily performed. The configuration described above is not necessarily employed, and the bonding member B1 may be so provided as to extend to the first surface 205 of the step section 204 but may not be in contact with the second surface 206, as shown in FIG. 22. The configuration in which the bonding member B1 does not extend beyond the intersection O can be achieved by optimizing the shape of the step section 204 in addition to the characteristics of the bonding member B1, such as the bonding conditions, the modulus of elasticity, and the viscosity. Further, the material of the bonding member B1 may contain fillers, which can fix a distance L2 between the substrate 2 and the base 91.

The method for manufacturing the inertial sensor 1 has been described. The method for manufacturing the inertial sensor 1 described above includes the step of bonding the device substrate 100 to the upper surface 202 of the substrate 2 having the lower surface 201 as the first principal surface and the upper surface 202 as the second principal surface, which face away from each other, the step of forming the capacitance-type sensor devices 3, 4, and 5 from the device substrate 100, the step of bonding the lid 6 to the upper surface 202 of the substrate 2, which serves as the second principal surface, to cover the sensor devices 3, 4, and 5, the step of forming the recessed step section 204 in the region between the lower surface 201 and the side surface 203 of the substrate 2, and the step of bonding the substrate 2 to the base 91 as the support substrate via the bonding member B1, as described above. In the step of bonding the substrate 2 to the base 91, the substrate 2 is so bonded to the base 91 that the bonding member B1 extends along the lower surface 201 of the substrate 2 and the step section 204.

Providing the substrate 2 with the step section 204 as described above allows formation of the space Q, which causes the bonding member B1 to stay in the region between the step section 204 and the base 91, which effectively prevents the bonding member B1 from spreading outward. The state in which the bonding member B1 rises in the form of a fillet along the side surface 203 can therefore be effectively suppressed, unlike in the related art. As a result, stress induced in accordance with the difference in coefficient of thermal expansion between the bonding member B1 and the substrate 2 is effectively distributed and is therefore unlikely to be transmitted to the upper surface 202 of the substrate 2. Since the sensor devices 3, 4, and 5 are provided on the side facing the upper surface 202, the stress is unlikely to be transmitted to the upper surface 202 and is therefore unlikely to be transmitted to the sensor devices 3, 4, and 5. Variation of the value of the output from the inertial sensor 1 due to the stress is therefore suppressed, whereby the inertial sensor 1 can accurately detect the acceleration Ax, Ay, and Az.

In the manufacturing method described above, the step section 204 is formed by half dicing, as described above. The half dicing allows the step section 204 to be readily formed. Further, the dicing saw D roughens the surface of each of the step sections 204 to form minute irregularities on the surface. An anchor effect is thus achieved, whereby the bonding strength between the substrates 2 and the bonding member B1 can be increased.

Second Embodiment

Figure 23:
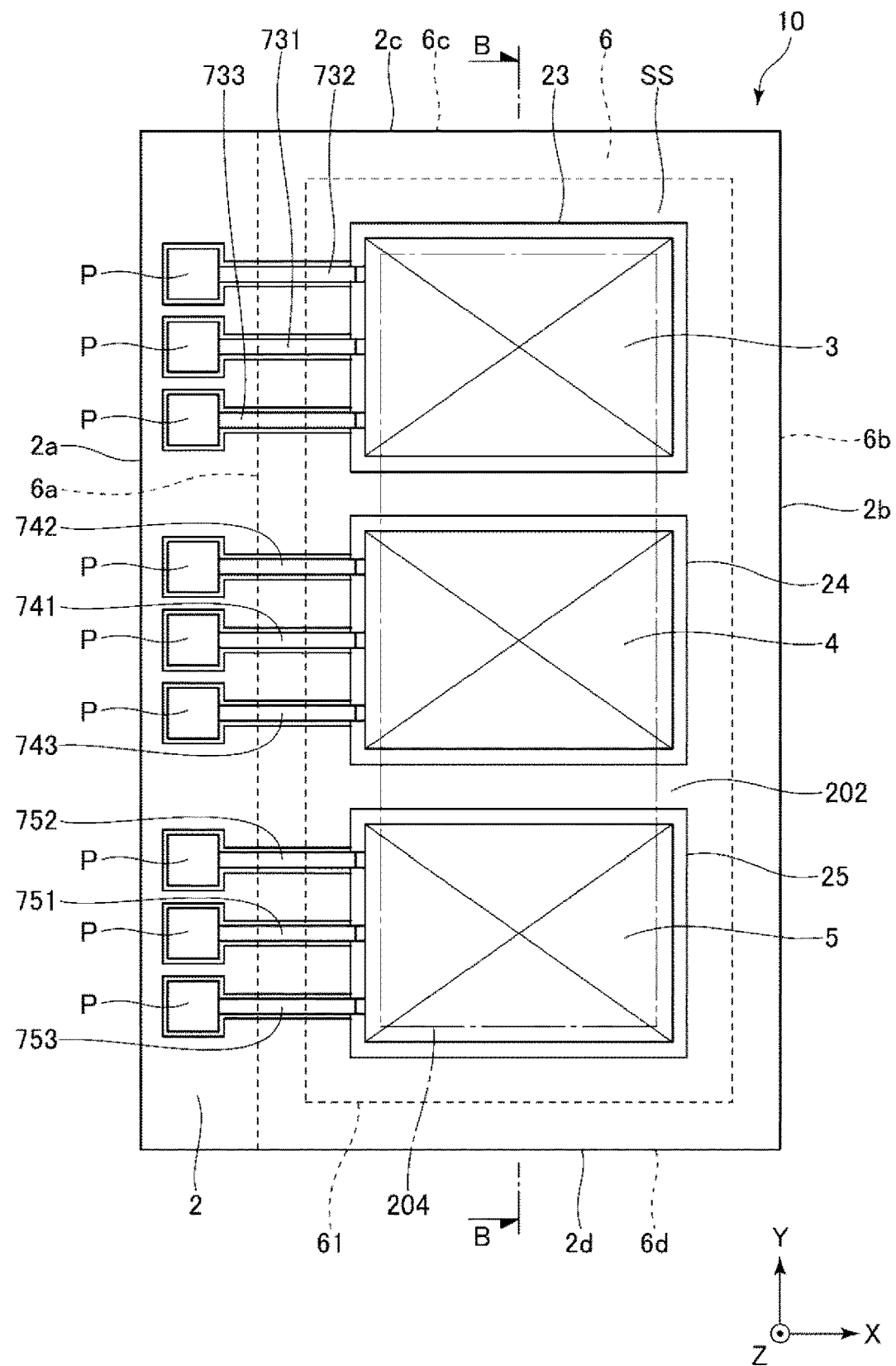
FIG. 23 is a plan view of a sensor main body of an inertial sensor according to a second embodiment.
Figure 24:
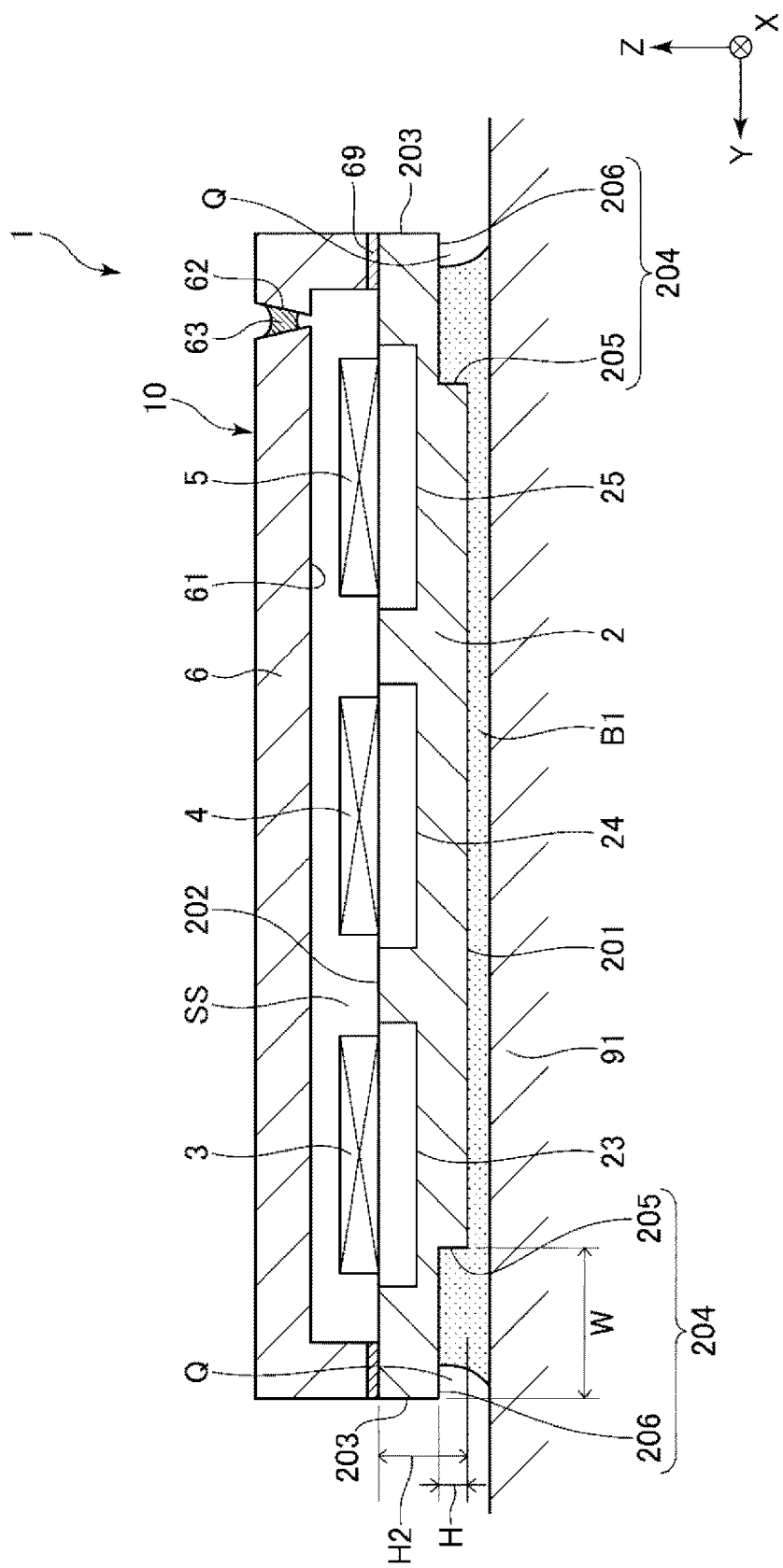
FIG. 24 is a cross-sectional view of the sensor main body taken along the line B-B in FIG. 23.

FIG. 23 is a plan view of a sensor main body of an inertial sensor according to a second embodiment. FIG. 24 is a cross-sectional view of the sensor main body taken along the line B-B in FIG. 23.

The present embodiment is the same as the first embodiment described above except the step section 204 is configured differently. The following description of the present embodiment will be primarily made of the difference from the embodiment described above, and the same items will not be described. In FIGS. 23 and 24, the same configurations as those in the embodiment described above have the same reference characters.

The step section 204 in the present embodiment is so provided as to extend to the exterior and interior of the recesses 23, 24, and 25 in the plan view viewed along the axis-Z direction, as shown in FIGS. 23 and 24. That is, the step section 204 is so provided as to overlap with the bottom surfaces of the recesses 23, 24, and 25 in the plan view viewed along the axis-Z direction. As a result, for example, the space Q is larger than in the first embodiment described above, and the larger space Q can prevent the bonding member B1 from spreading by a greater degree, which can more effectively prevent the bonding member B1 from rising along the side surface 203.

In the present embodiment, the entire circumference of the step section 204 so provided as to extend to the exterior and interior of the recesses 23, 24, and 25, but not necessarily, and at least part of the entire circumference of the step section 204 only needs to be provided as to extend to the exterior and interior of the recesses 23, 24, and 25. In this case, at least 50% of the entire circumference of the step section 204 is preferably provided as to extend to the exterior and interior of the recesses 23, 24, and 25, at least 80% of the entire circumference of the step section 204 is more preferably provided as to extend to the exterior and interior of the recesses 23, 24, and 25, and at least 90% of the entire circumference of the step section 204 is still more preferably provided as to extend to the exterior and interior of the recesses 23, 24, and 25.

The thus configured second embodiment can also provide the same effects as those provided by the first embodiment described above.

Third Embodiment

Figure 25:
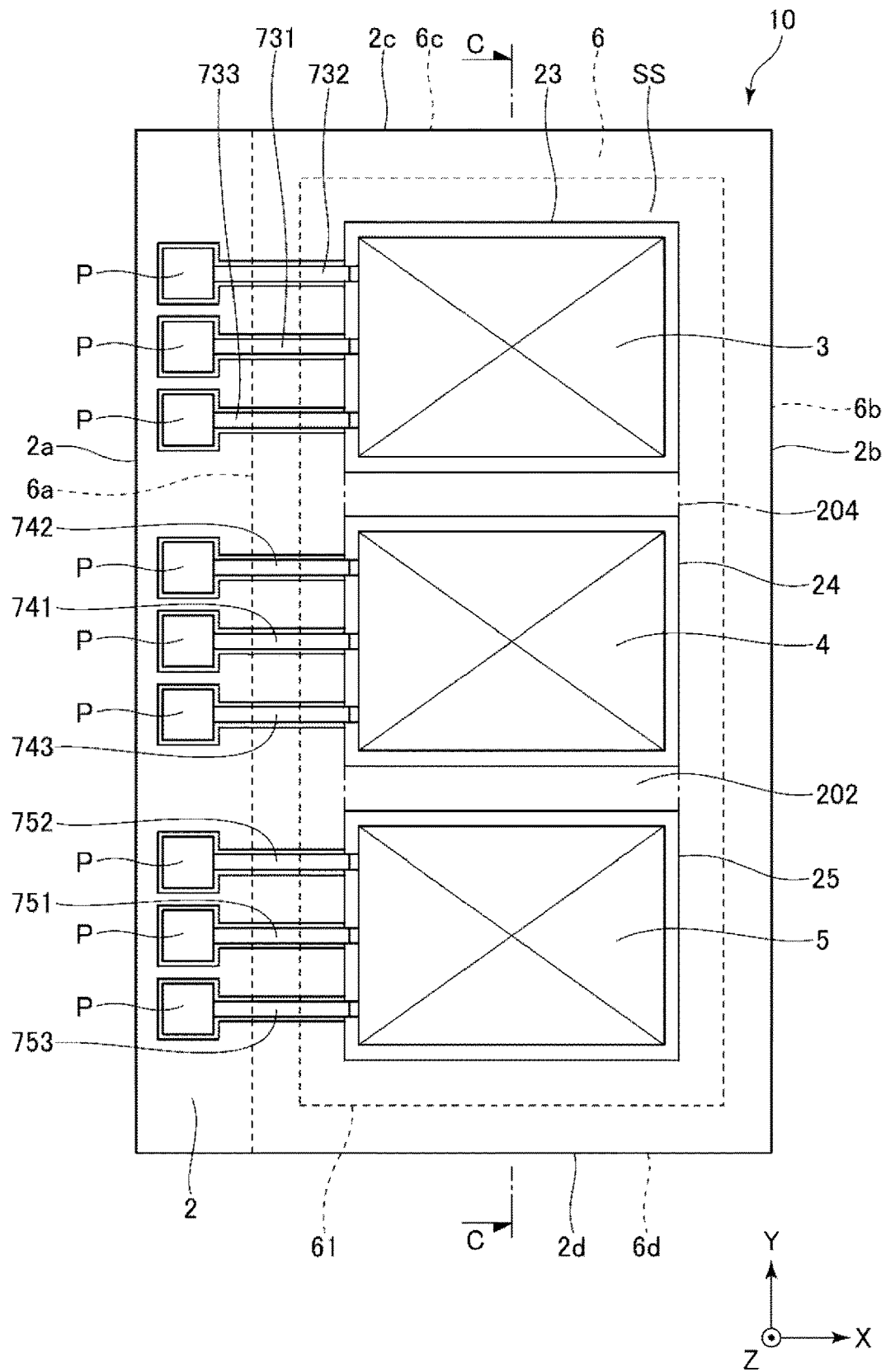
FIG. 25 is a plan view of a sensor main body of an inertial sensor according to a third embodiment.
Figure 26:
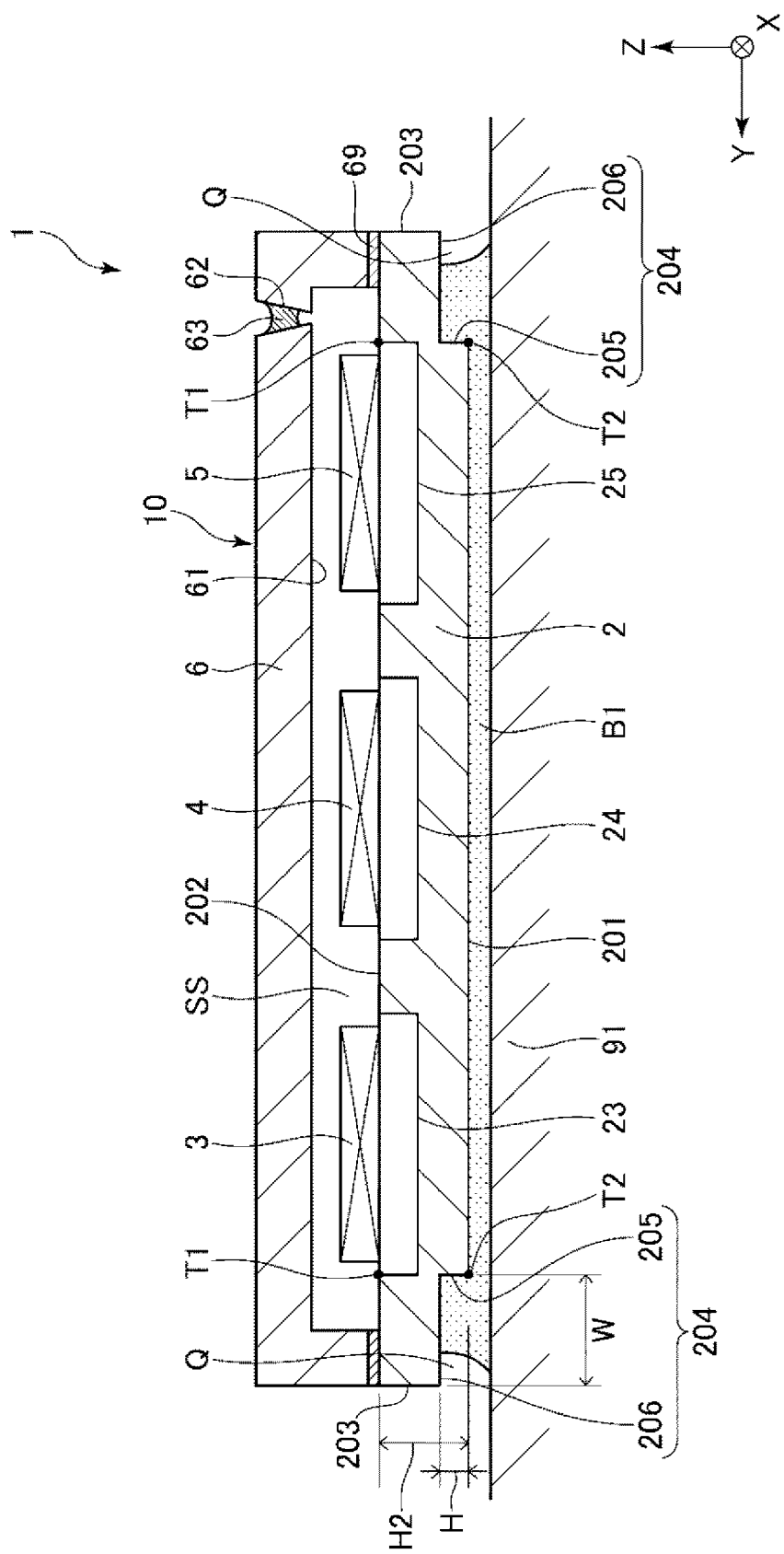
FIG. 26 is a cross-sectional view of the sensor main body taken along the line C-C in FIG. 25.

FIG. 25 is a plan view of a sensor main body of an inertial sensor according to a third embodiment. FIG. 26 is a cross-sectional view of the sensor main body taken along the line C-C in FIG. 23.

The present embodiment is the same as the first embodiment described above except the step section 204 is configured differently. The following description of the present embodiment will be primarily made of the difference from the embodiments described above, and the same items will not be described. In FIGS. 25 and 26, the same configurations as those in the embodiments described above have the same reference characters.

The step section 204 in the present embodiment is so configured that a boundary T1 between the upper surface 202 and the recesses 23, 24, 25 coincides with a boundary T2 between the lower surface 201 and the step section 204 in the plan view viewed along the axis-Z direction, as shown in FIGS. 25 and 26. As a result, for example, the effects provided by the first embodiment described above and the effect provided by the second embodiment can both be provided. That is, a sufficiently large space Q can be ensured with a decrease in mechanical strength of the substrate 2 suppressed.

In the present embodiment, the boundaries T1 and T2 coincide with each other along the entire circumference of the step section 204, but not necessarily, and the boundaries T1 and T2 only needs to coincide with each other along at least part of the entire circumference of the step section 204. In this case, the boundaries T1 and T2 preferably coincide with each other along at least 50% of the entire circumference of the step section 204, the boundaries T1 and T2 more preferably coincide with each other along at least 80% of the entire circumference of the step section 204, and the boundaries T1 and T2 still more preferably coincide with each other along at least 90% of the entire circumference of the step section 204.

The thus configured third embodiment can also provide the same effects as those provided by the first embodiment described above.

Fourth Embodiment

Figure 27:
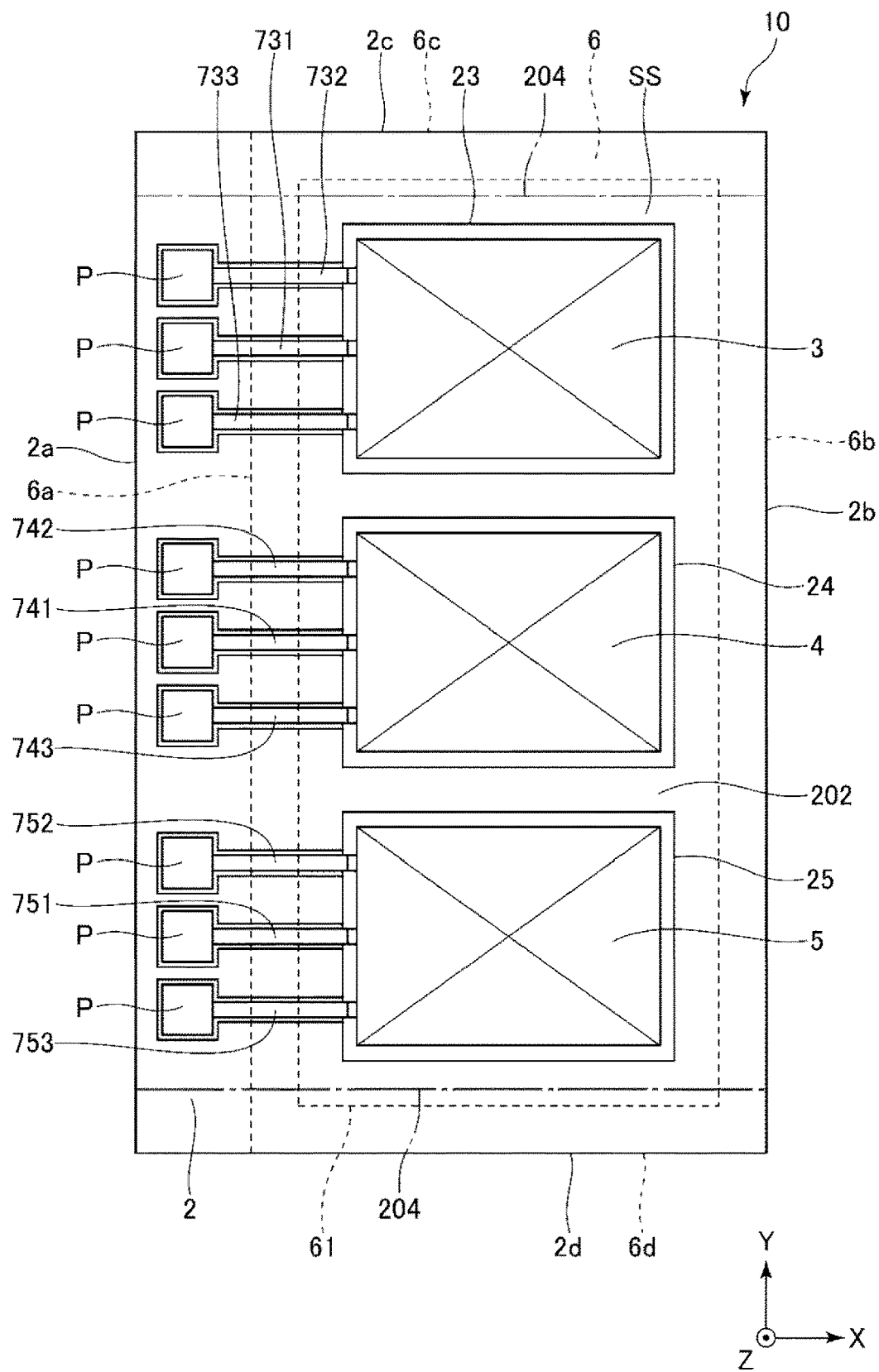
FIG. 27 is a plan view of a sensor main body of an inertial sensor according to a fourth embodiment.

FIG. 27 is a plan view of a sensor main body of an inertial sensor according to a fourth embodiment.

The present embodiment is the same as the first embodiment described above except the step section 204 is configured differently. The following description of the present embodiment will be primarily made of the difference from the embodiments described above, and the same items will not be described. In FIG. 27, the same configurations as those in the embodiments described above have the same reference characters.

The step section 204 in the present embodiment is not formed along the entire circumference of the substrate 2 but is formed along the sides 2c and 2d of the substrate, as shown in FIG. 27. The thus configured fourth embodiment can also provide the same effects as those provided by the first embodiment described above.

Fifth Embodiment

Figure 28:
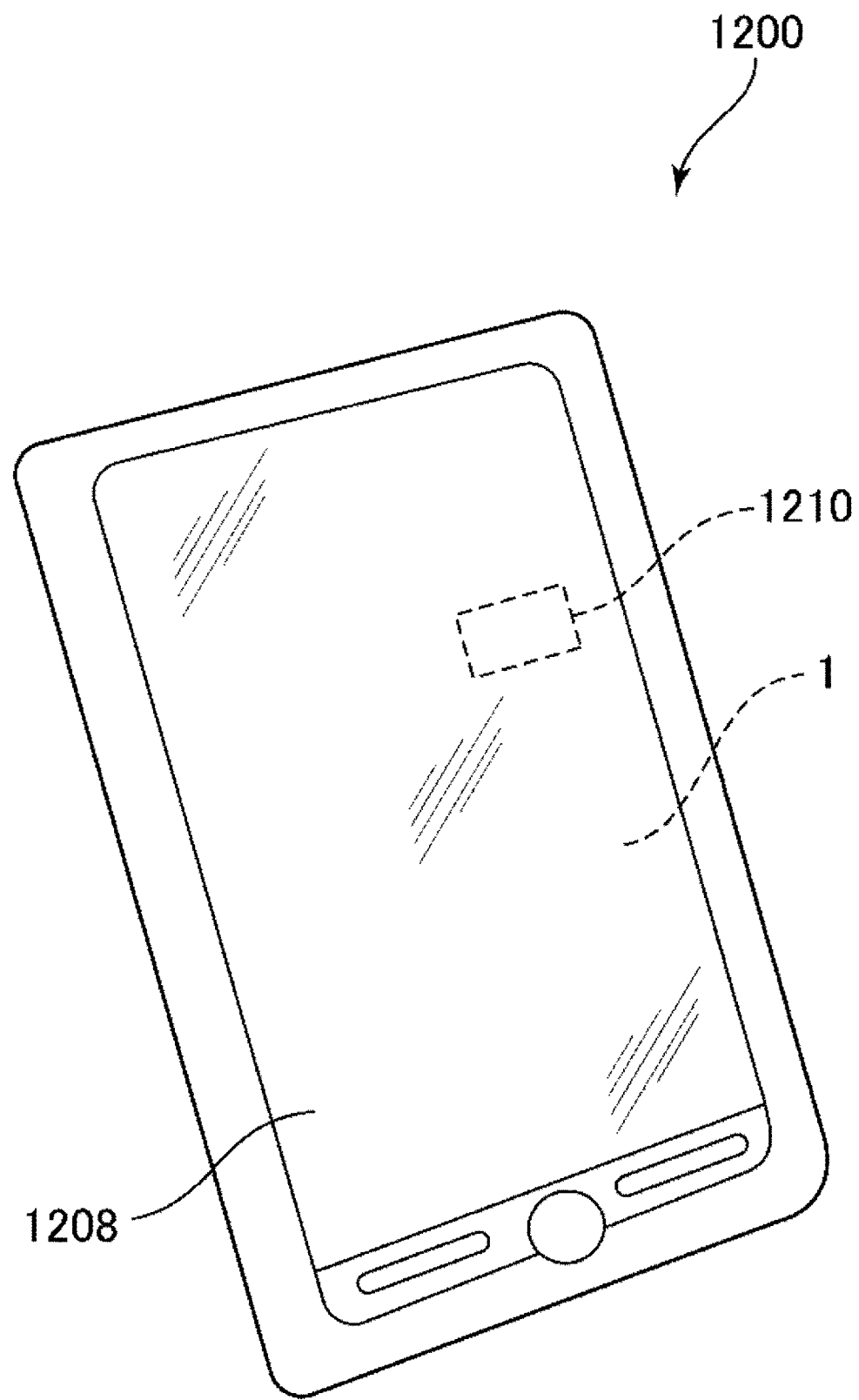
FIG. 28 is a perspective view of a smartphone according to a fifth embodiment.

FIG. 28 is a perspective view of a smartphone according to a fifth embodiment.

A smartphone 1200 shown in FIG. 28 accommodates the inertial sensor 1 and a control circuit 1210, which performs control based on a detection signal outputted from the inertial sensor 1. Detection data detected with the inertial sensor 1 is transmitted to the control circuit 1210, which then recognizes the attitude and behavior of the smartphone 1200 based on the received detection data and can change an image displayed on a display section 1208, issue an alarm sound or an effect sound, or drive a vibration motor to vibrate the main body.

The smartphone 1200 as an electronic instrument includes the inertial sensor 1 and the control circuit 1210, which performs control based on the detection signal outputted from the inertial sensor 1. The smartphone 1200 can therefore benefit from the above-mentioned effects provided by the inertial sensor 1 and hence has high reliability.

An electronic instrument including a built-in inertial sensor 1 is not limited to a specific instrument. Conceivable examples of the electronic instrument may include, in addition to the smartphone 1200, a personal computer, a digital still camera, a tablet terminal, a timepiece, a smartwatch, an inkjet printer, a laptop personal computer, a television receiver, a wearable terminal, such as a head mounted display (HMD), a video camcorder, a video tape recorder, a car navigator, a pager, an electronic notepad, an electronic dictionary, a desktop calculator, an electronic game console, a word processor, a workstation, a TV phone, a security television monitor, electronic binoculars, a POS terminal, a medical instrument, a fish finder, a variety of measuring instruments, an instrument for a mobile terminal base station, a variety of meters for car, airplane, and ship, a flight simulator, and a network server.

Sixth Embodiment

Figure 29:
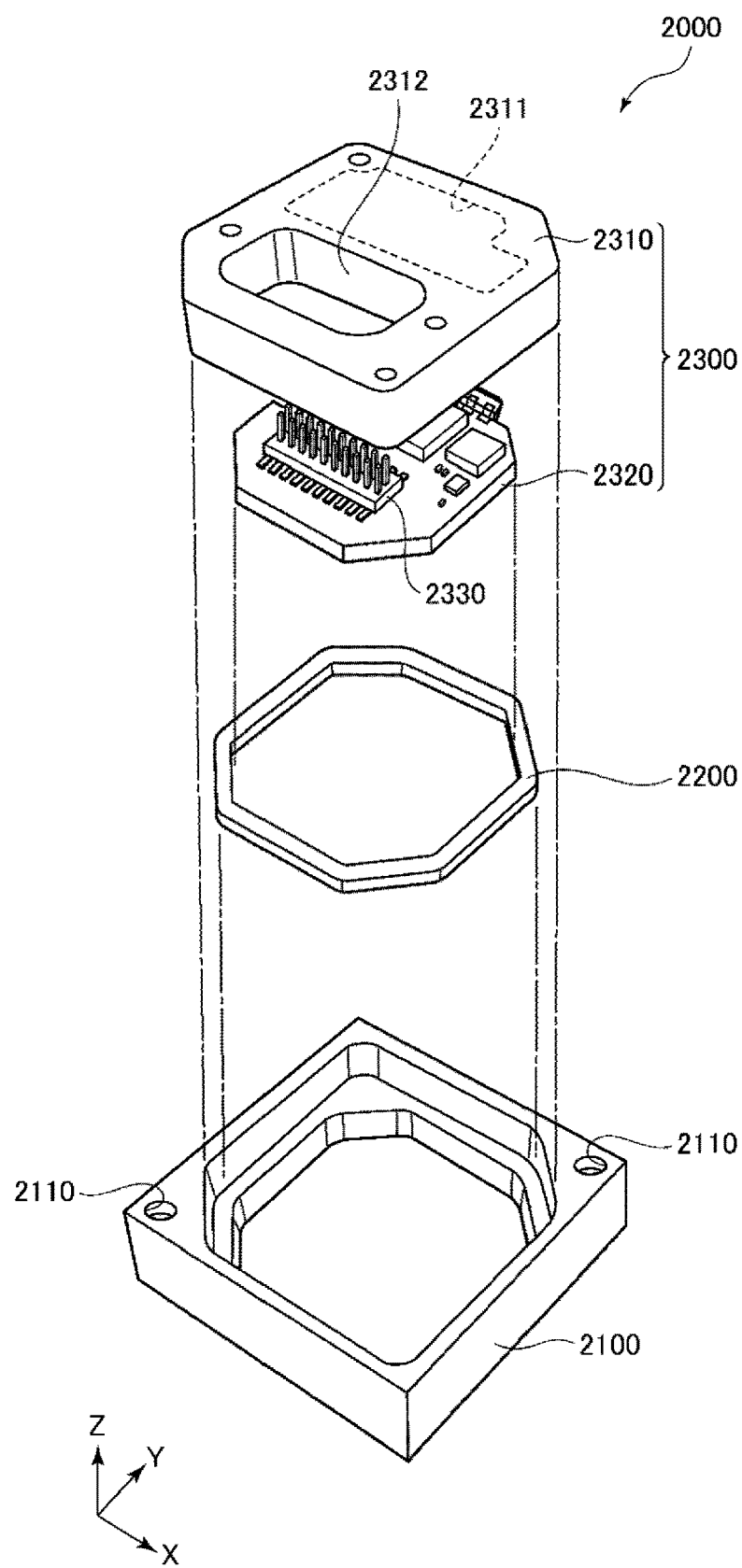
FIG. 29 is an exploded perspective view showing an inertial measurement unit according to a sixth embodiment.
Figure 30:
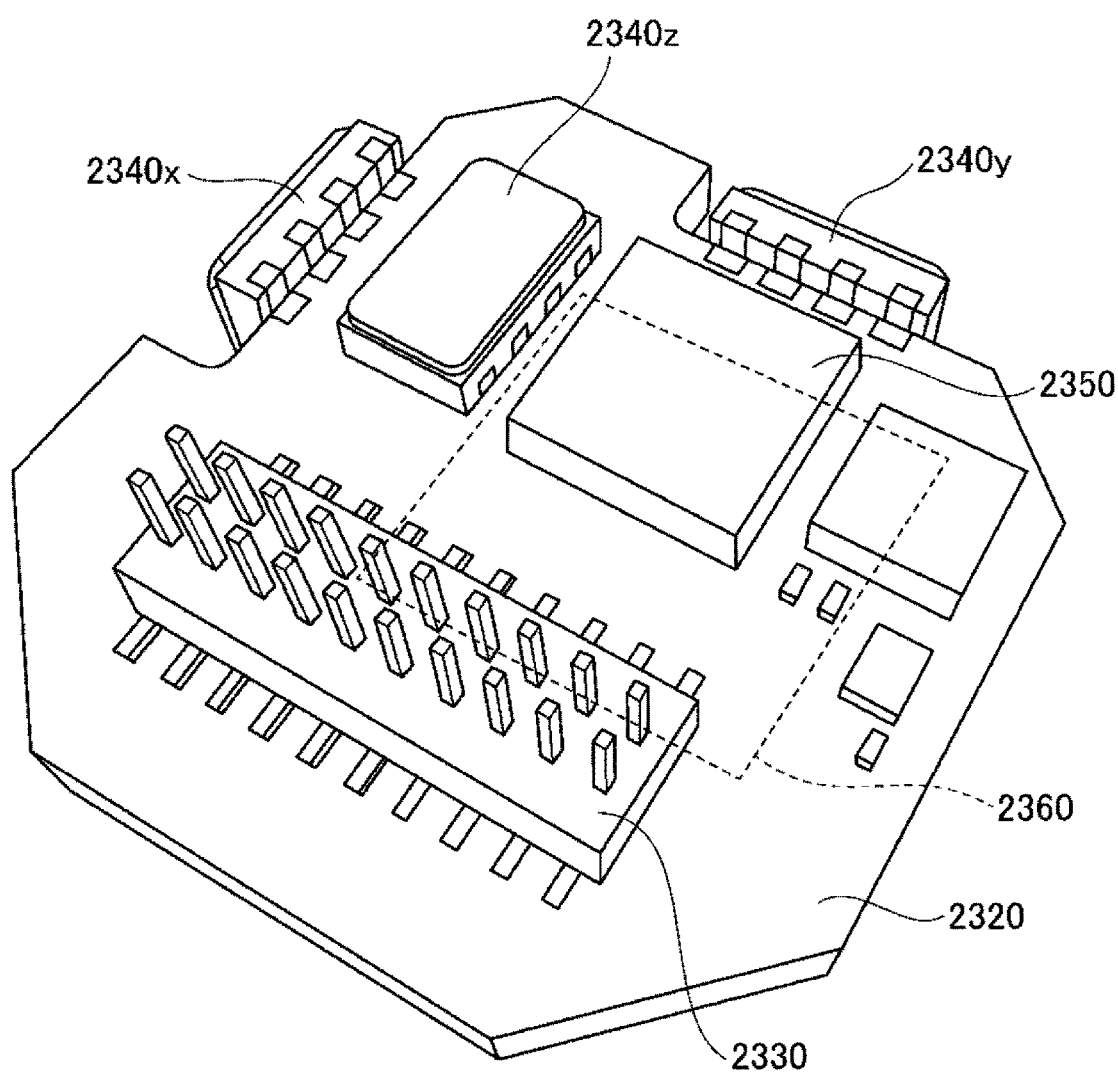
FIG. 30 is a perspective view of a substrate provided in the inertial measurement unit shown in FIG. 29.

FIG. 29 is an exploded perspective view showing an inertial measurement unit according to a sixth embodiment. FIG. 30 is a perspective view of a substrate provided in the inertial measurement unit shown in FIG. 29.

An inertial measurement unit (IMU) 2000 shown in FIG. 29 is an inertial measurement unit that detects the attitude and behavior of an apparatus to which the inertial measurement unit 2000 is attached, such as an automobile and a robot. The inertial measurement unit 2000 functions as a six-axis motion sensor including a three-axis acceleration sensor and a three-axis angular velocity sensor.

The inertial measurement unit 2000 is a rectangular parallelepiped having a substantially square shape in the plan view. Two threaded holes 2110 as fixing sections are formed in the vicinity of two vertices of the square shape that are located on a diagonal of the square. Two screws screwed into the two threaded holes 2110 can fix the inertial measurement unit 2000 to an attachment surface of the apparatus to which the inertial measurement unit 2000 is attached, such as an automobile. The inertial measurement unit 2000 can be so reduced in size as to be incorporated, for example, in a smartphone and a digital still camera by part selection and design change.

The inertial measurement unit 2000 includes an outer enclosure 2100, a bonding member 2200, and a sensor module 2300, and the sensor module 2300 is inserted into the outer enclosure 2200 via the bonding member 2200. The outer shape of the outer enclosure 2100 is a rectangular parallelepiped having a substantially square shape in the plan view, as the overall shape of the inertial measurement unit 2000 described above. The threaded holes 2110 are formed in the vicinity of two vertices of the square shape that are located on a diagonal of the square. The outer enclosure 2100 has a box-like shape, and the sensor module 2300 is accommodated in the outer enclosure 2100.

The sensor module 2300 includes an inner enclosure 2310 and a substrate 2320. The inner enclosure 2310 is a member that supports the substrate 2320 and is so shaped as to be accommodated in the outer enclosure 2100. The inner enclosure 2310 has a recess 2311, which prevents the inner enclosure 2310 from coming into contact with the substrate 2320, and an opening 2312, which exposes a connector 2330, which will be described later. The thus configured inner enclosure 2310 is bonded to the outer enclosure 2100 via the bonding member 2200. The substrate 2320 is bonded to the lower surface of the inner enclosure 2310 via an adhesive.

The connector 2330, an angular velocity sensor 2340z, which detects angular velocity around the axis Z, an acceleration sensor 2350, which detects acceleration in the axes X, Y, and Z, and other components are mounted on the upper surface of the substrate 2320, as shown in FIG. 30. An angular velocity sensor 2340x, which detects angular velocity around the axis X, and an angular velocity sensor 2340y, which detects angular velocity around the axis Y, are mounted on the side surface of the substrate 2320. The inertial sensor described in any of the embodiments can be used as each of the sensors described above.

A control IC 2360 is mounted on the lower surface of the substrate 2320. The control IC 2360 is a micro controller unit (MCU) and controls each portion of the inertial measurement unit 2000. A storage stores a program that specifies the order and content for detecting acceleration and angular velocity, a program that digitizes detected data and incorporates the digitized data in packet data, data associated with the programs, and other pieces of information. A plurality of other electronic parts are mounted on the substrate 2320.

Seventh Embodiment

Figure 31:
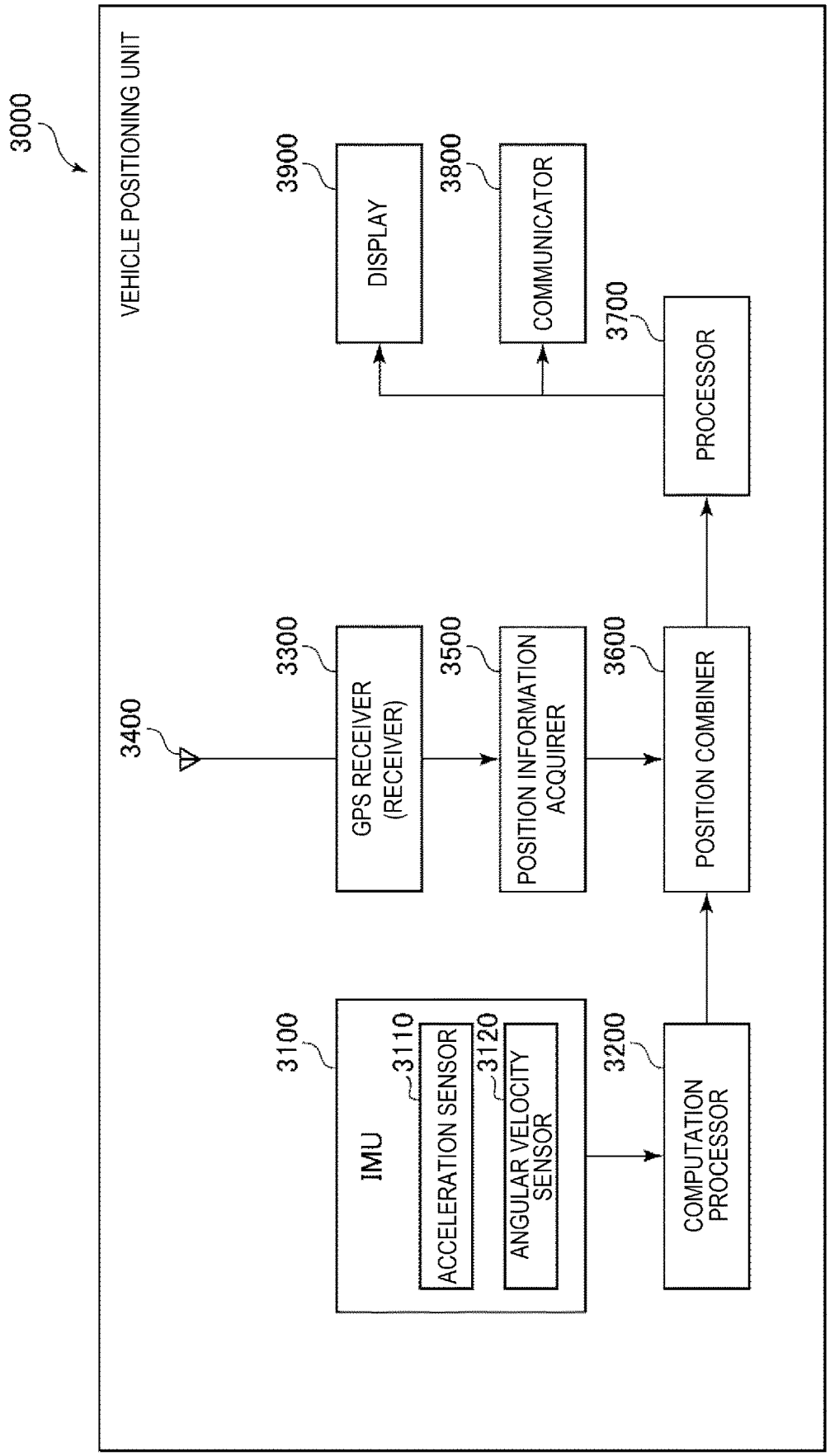
FIG. 31 is a block diagram showing the overall system of a vehicle positioning unit according to a seventh embodiment.
Figure 32:
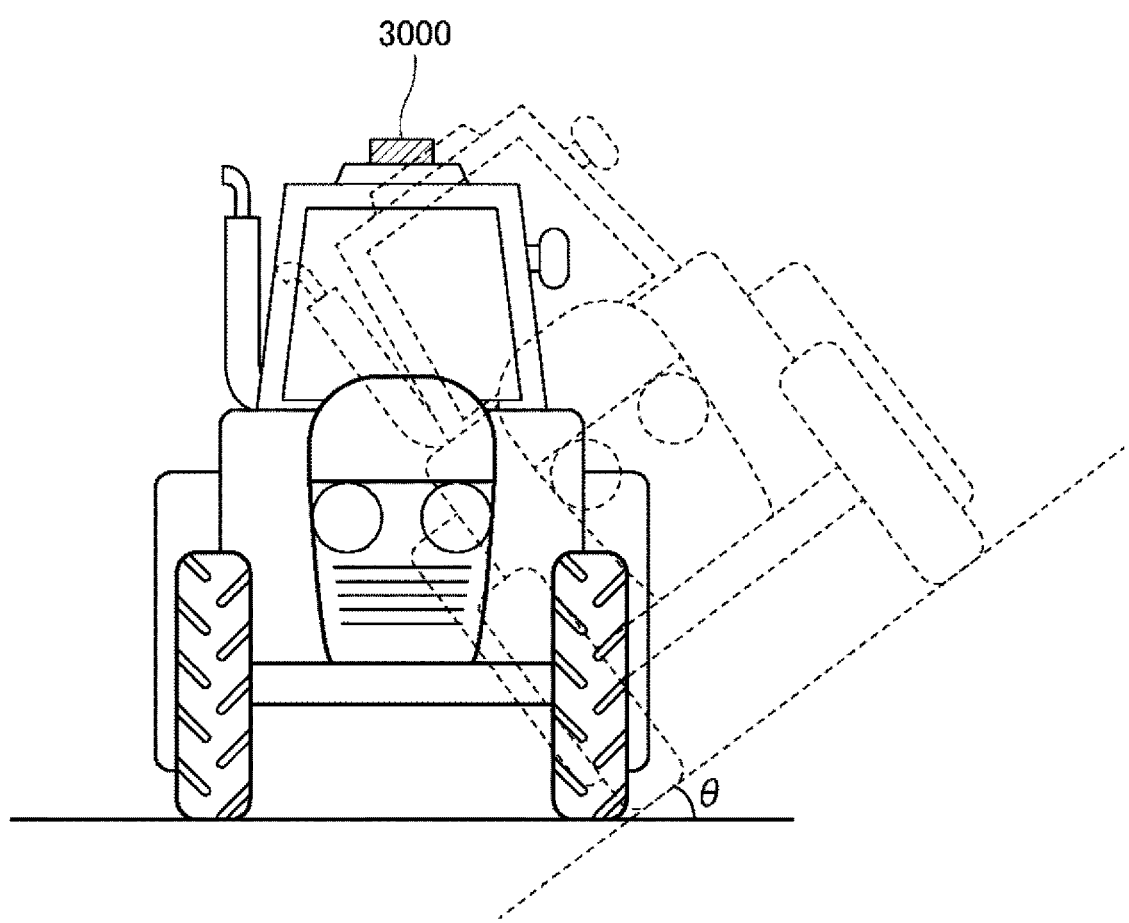
FIG. 32 shows an effect of the vehicle positioning unit shown in FIG. 31.

FIG. 31 is a block diagram showing the overall system of a vehicle positioning unit according to a seventh embodiment. FIG. 32 shows an effect of the vehicle positioning unit shown in FIG. 31.

A vehicle positioning unit 3000 shown in FIG. 31 is attached to a vehicle when used and is a unit for measuring the position of the vehicle. The vehicle is not limited to a specific vehicle and may be any of a bicycle, an automobile, an autocycle, a train, an airplane, a ship, and any other vehicle, and the present embodiment will be described with reference to a case where a four-wheeled automobile is used as the vehicle.

The vehicle positioning unit 3000 includes an inertial measurement unit 3100 (IMU), a computation processor 3200, a GPS receiver 3300, a reception antenna 3400, a position information acquirer 3500, a position combiner 3600, a processor 3700, a communicator 3800, and a display 3900. The inertial measurement unit 3100 can, for example, be the inertial measurement unit 2000 described above.

The inertial measurement unit 3100 includes a three-axis acceleration sensor 3110 and a three-axis angular velocity sensor 3120. The computation processor 3200 receives acceleration data from the acceleration sensor 3110 and angular velocity data from the angular velocity sensor 3120, performs inertial navigation computation on the data, and outputs inertial navigation positioning data containing the acceleration and attitude of the vehicle.

The GPS receiver 3300 receives signals from GPS satellites via the reception antenna 3400. The position information acquirer 3500 outputs GPS positioning data representing the position (latitude, longitude, and altitude), velocity, and orientation of the vehicle positioning unit 3000 based on the signals received by the GPS receiver 3300. The GPS positioning data also contains status data representing the reception state, the reception time, and other pieces of information.

The position combiner 3600 calculates the position of the vehicle, specifically, the position on the ground along which the vehicle is traveling based on the inertial navigation positioning data outputted from the computation processor 3200 and the GPS positioning data outputted from the position information acquirer 3500. For example, even when the positions of the vehicle contained in the GPS positioning data are equal to one another, but the vehicle has a different attitude due, for example, to inclination e of the ground and other factors, as shown in FIG. 32, the position on the ground along which the vehicle is traveling varies. An accurate position of the vehicle cannot therefore be calculated based only on the GPS positioning data. In this case, the position combiner 3600 uses the inertial navigation positioning data to calculate the position on the ground along which the vehicle is traveling.

The processor 3700 performs predetermined processing on position data outputted from the position combiner 3600, and the resultant data is displayed as the result of the positioning on the display 3900. The position data may be transmitted via the communicator 3800 to an external apparatus.

Eighth Embodiment

Figure 33:
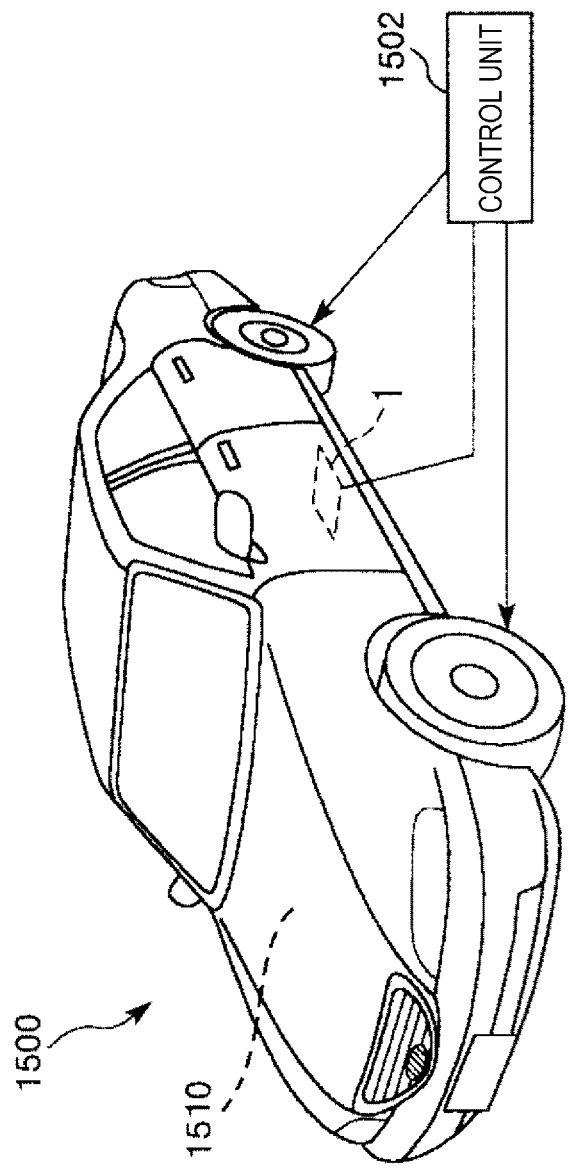
FIG. 33 is a perspective view showing a vehicle according to an eighth embodiment.

FIG. 33 is a perspective view showing a vehicle according to an eighth embodiment.

An automobile 1500 as the vehicle shown in FIG. 33 includes a system 1510, which is at least one of an engine system, a brake system, and a keyless entry system. The inertial sensor 1 is built in the automobile 1500 and can detect the attitude of the vehicle body. The detection signal from the inertial sensor 1 is supplied to a control unit 1502, which can control the system 1510 based on the signal.

As described above, the automobile 1500 includes the inertial sensor 1 and the control unit 1502, which performs control based on the detection signal outputted from the inertial sensor 1. The automobile 1500 can therefore benefit from the above-mentioned effects provided by the inertial sensor 1 and hence has high reliability.

The inertial sensor 1 can also be widely used, with a car navigation system, a car air conditioner, an anti-lock braking system (ABS), an airbag, a tire pressure monitoring system (TPMS), an engine control system, and an electronic control unit (ECU) that monitors or otherwise observes a battery in a hybrid automobile and an electric automobile. The vehicle is not limited to the automobile 1500 and may instead, for example, be an airplane, a rocket, an artificial satellite, a ship, an automated guided vehicle (AGV), a bipedal walking robot, and a drone or any other unmanned airplane.

The inertial sensor, the electronic instrument, the vehicle, and the method for manufacturing the inertial sensor according to the present disclosure have been described with reference to the embodiments in the drawings, but the present disclosure is not limited thereto, and the configuration of each portion can be replaced with an arbitrary configuration having the same function.

What is claimed is:
1. An inertial sensor comprising:
a support substrate;
a sensor main body supported by the support substrate; and
a bonding member that is located between the support substrate and the sensor main body and bonds the sensor main body to the support substrate,
wherein the sensor main body includes:
a sensor substrate bonded to the support substrate via the bonding member; and
a capacitance-type sensor device provided at a side of the sensor substrate opposite to the support substrate,
the sensor substrate has a side surface, a first principal surface facing a main surface of the support substrate, and a recessed step section that is located between the side surface and the first principal surface and connects the side surface to the first principal surface, the bonding member extends along the first principal surface and the recessed step section, the side surface of the sensor substrate extends on a first plane, and a cavity is formed by an inner surface of the recessed step section, the main surface of the support substrate, and the first plane, and the cavity is filled with a vacant space and the bonding member.

2. The inertial sensor according to claim 1, wherein the bonding member is not in contact with the side surface.

3. The inertial sensor according to claim 1, wherein the sensor substrate has a recess in a second principal surface that faces away from the first principal surface and is so located as to face the sensor device, and the recess overlaps with the sensor device in a plan view, and a bottom surface of the recess is located closer to the second principal surface than the recessed step section.

4. The inertial sensor according to claim 3, wherein the recessed step section is provided between the recess and the side surface in the plan view.

5. The inertial sensor according to claim 3, wherein the recessed step section overlaps with the bottom surface of the recess in the plan view.

6. The inertial sensor according to claim 3, wherein a boundary between the second principal surface and the recess coincides with a boundary between the first principal surface and the recessed step section in the plan view.

7. An electronic instrument comprising:

the inertial sensor according to claim 1; and a control circuit that performs control based on a detection signal outputted from the inertial sensor.

8. A vehicle comprising:

the inertial sensor according to claim 1; and a control unit that performs control based on a detection signal outputted from the inertial sensor.

* * * * *